United States Patent
Takase et al.

(10) Patent No.: US 10,367,108 B2
(45) Date of Patent: Jul. 30, 2019

(54) PHOTODETECTION DEVICE AND IMAGING DEVICE

(71) Applicant: Panasonic Intellectual Property Management Co., Ltd., Osaka (JP)

(72) Inventors: Masayuki Takase, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/000,885

(22) Filed: Jun. 6, 2018

(65) Prior Publication Data

US 2019/0006543 A1    Jan. 3, 2019

(30) Foreign Application Priority Data

Jun. 29, 2017  (JP) .................................. 2017-127582

(51) Int. Cl.
| | |
|---|---|
| H01L 27/14 | (2006.01) |
| H01L 31/0352 | (2006.01) |
| H01L 27/146 | (2006.01) |
| H01L 31/101 | (2006.01) |

(52) U.S. Cl.
CPC ........... *H01L 31/035281* (2013.01); *H01L 27/14665* (2013.01); *H01L 31/101* (2013.01)

(58) Field of Classification Search
CPC .......... H01L 31/035281; H01L 31/101; H01L 27/14665; H04N 5/3698
See application file for complete search history.

(56) References Cited

U.S. PATENT DOCUMENTS

| | | | | |
|---|---|---|---|---|
| 9,190,449 | B2* | 11/2015 | Kobayashi | ........ H01L 27/14806 |
| 2008/0030607 | A1 | 2/2008 | Ikeda et al. | |
| 2009/0134437 | A1* | 5/2009 | Nakashima | ....... H01L 27/14643 |
| | | | | 257/292 |
| 2012/0200842 | A1 | 8/2012 | Kamiyama et al. | |
| 2017/0006241 | A1* | 1/2017 | Shishido | ................ H04N 5/378 |

FOREIGN PATENT DOCUMENTS

| | | |
|---|---|---|
| JP | 2007-201160 | 8/2007 |
| JP | 2011-082358 | 4/2011 |
| JP | 2017-017583 | 1/2017 |

* cited by examiner

*Primary Examiner* — Trang Q Tran
(74) *Attorney, Agent, or Firm* — McDermott Will & Emery LLP

(57) ABSTRACT

A photodetection device includes: a photoelectric converter generating charge; a first transfer channel having first and second ends, the first end being connected to the photoelectric converter, charge from the photoelectric converter being transferred from the first end toward the second end; a second transfer channel diverging from the first transfer channel at a first position; a third transfer channel diverging from the first transfer channel at a second position, further than the first position from the first end; a first charge accumulator accumulating charge transferred through the second transfer channel; a second charge accumulator accumulating charge transferred through the third transfer channel; a first gate electrode switching between transfer/cutoff of charge in the first transfer channel; and at least one second gate electrode switching between transfer/cutoff of charge in the second and third transfer channels, the third transfer channel being wider than the second transfer channel.

6 Claims, 18 Drawing Sheets

PHOTODETECTION DEVICE AND IMAGING DEVICE

BACKGROUND

1. Technical Field

The present disclosure relates to a photodetection device that detects light.

2. Description of the Related Art

Photodetection devices that detect a timing at which light is incident are known (see Japanese Unexamined Patent Application Publication No. 2017-17583, for example). According to these photodetection devices, a timing at which light is incident can be detected at an accuracy of a certain degree.

SUMMARY

A further improvement in temporal resolution is desired in the detection of a timing at which light is incident.

In one general aspect, the techniques disclosed here feature a photodetection device provided with: a photoelectric converter that generates charge; a first charge transfer channel that has a first end and a second end, the first end being connected to the photoelectric converter, charge from the photoelectric converter being transferred in the first charge transfer channel in a first direction from the first end toward the second end; a second charge transfer channel that diverges from the first charge transfer channel at a first position of the first charge transfer channel; a third charge transfer channel that diverges from the first charge transfer channel at a second position of the first charge transfer channel, the second position being further than the first position from the first end in the first direction; a first charge accumulator that accumulates charge transferred from the first charge transfer channel through the second charge transfer channel; a second charge accumulator that accumulates charge transferred from the first charge transfer channel through the third charge transfer channel; a first gate electrode that switches between transfer and cutoff of charge in the first charge transfer channel; and at least one second gate electrode that switches between transfer and cutoff of charge in the second charge transfer channel, and that switches between transfer and cutoff of charge in the third charge transfer channel. A width of the third charge transfer channel is greater than a width of the second charge transfer channel in a plan view.

General or specific aspects may be realized by means of an element, a device, a module, a system, an integrated circuit, or a method. Furthermore, general or specific aspects may be realized by means of an arbitrary combination of an element, a device, a module, a system, an integrated circuit, and a method.

Additional benefits and advantages of the disclosed embodiments will be apparent from the specification and figures. The benefits and/or advantages may be individually provided by the various embodiments or features disclosed in the specification and figures, and need not all be provided in order to obtain one or more of the same.

DETAILED DESCRIPTION (Underlying Knowledge Forming Basis of Aspect of the Present Disclosure)

Here, first, a photodetection device of a reference example will be described.

Figure 19:
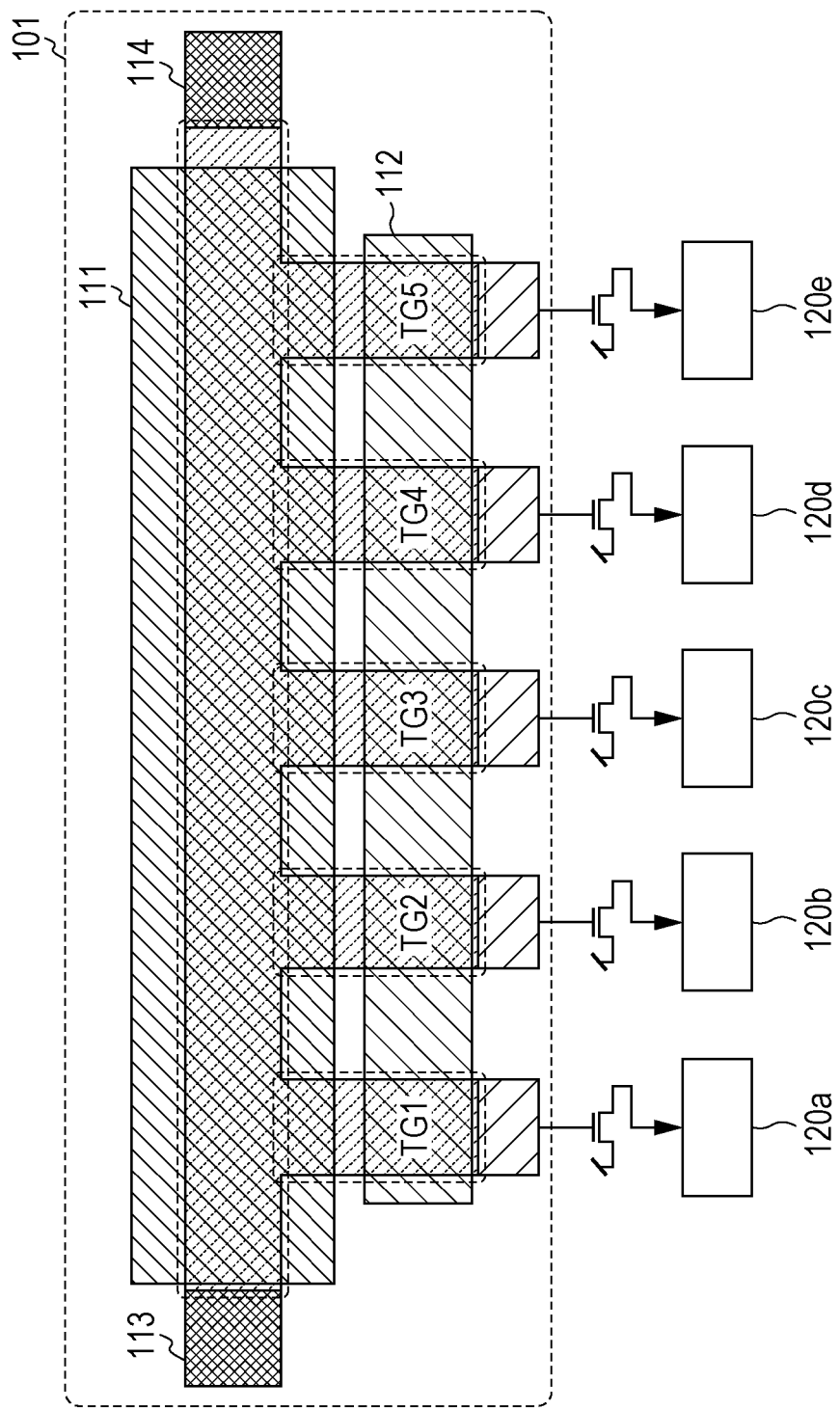
FIG. 19 is a configuration diagram of a photodetection device according to a reference example.

FIG. 19 is a configuration diagram of the photodetection device (in other words, an imaging element 101) according to the reference example.

In the photodetection device of the reference example, first, a channel (also referred to as a transfer channel) is formed below a first gate electrode 111 by controlling the potential of the first gate electrode 111. Then, a charge group that has been generated by light being incident on a light receiving unit 113 is made to travel from the light receiving unit 113 side to a charge sweeping unit 114 side within that transfer channel. Then, while the charge group is traveling, at least a portion of that traveling charge group is guided to a plurality of FDs respectively connected to read circuits (120a to 120e), by controlling the potential of a second gate electrode 112. Then, by specifying the position of an FD from which at least a portion of the traveling charge group has been read, the time at which that charge group was generated, in other words, the timing at which light was incident, is detected.

Here, in the photodetection device of the reference example, as depicted in FIG. 19, the widths of each transfer channel that diverges from the channel formed below the first gate electrode 111 are equal.

In relation to the photodetection device of the reference example, the inventors repeatedly carried out investigations in order to further improve temporal resolution in the detection of a timing at which light is incident.

Figure 20:
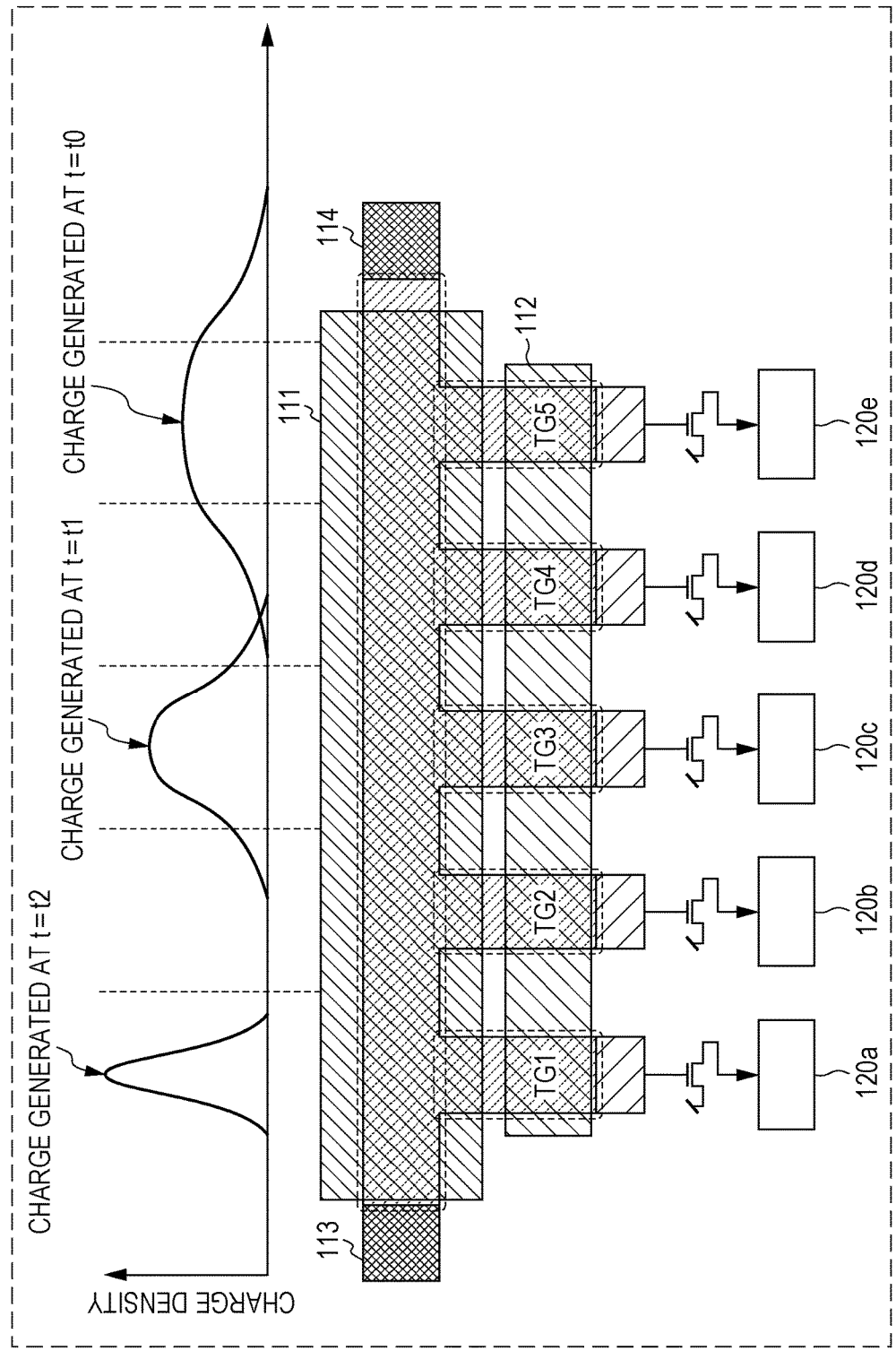
FIG. 20 is a schematic view depicting the distribution of a charge group that is traveling, in the photodetection device according to the reference example.

FIG. 20 is a schematic view depicting the distribution of a charge group that is traveling, in the photodetection device of the reference example.

As depicted in the same drawing, the distribution of the charge density of the traveling charge group widens as the travel distance thereof increases, in other words, as the charge group travels further from the light receiving unit 113. Therefore, a charge group that has traveled to a position far from the light receiving unit 113 (in the vicinity of TG3, TG4, and TG5 in FIG. 19, for example) is sometimes read by a plurality of read circuits. Furthermore, in a case where a first charge group and a second charge group that are different from each other have traveled to a position far from the light receiving unit 113 (in the vicinity of TG3, TG4, and TG5 in FIG. 20, for example), a region sometimes occurs in which a portion of the first charge group and a portion of the second charge group become mixed.

The inventors discovered that temporal resolution in the detection of a timing at which light is incident can be improved by suppressing the effects caused by these phenomena.

As a result of repeatedly carrying out such investigations, the inventors conceived of the photodetection device and the imaging device described hereinafter.

A photodetection device according to one aspect of the present disclosure is provided with: a photoelectric converter that generates charge; a first charge transfer channel that has a first end and a second end, the first end being connected to the photoelectric converter, charge from the photoelectric converter being transferred in the first charge transfer channel in a first direction from the first end toward the second end; a second charge transfer channel that diverges from the first charge transfer channel at a first position of the first charge transfer channel; a third charge transfer channel that diverges from the first charge transfer channel at a second position of the first charge transfer channel, the second position being further than the first position from the first end in the first direction; a first charge accumulator that accumulates charge transferred from the first charge transfer channel through the second charge transfer channel; a second charge accumulator that accumulates charge transferred from the first charge transfer channel through the third charge transfer channel; a first gate electrode that switches between transfer and cutoff of charge in the first charge transfer channel; and at least one second gate electrode that switches between transfer and cutoff of charge in the second charge transfer channel, and that switches between transfer and cutoff of charge in the third charge transfer channel. A width of the third charge transfer channel is greater than a width of the second charge transfer channel in a plan view.

According to the photodetection device having the aforementioned configuration, the width of the third charge transfer channel that is located at the far side in the transfer channel for charge from the photoelectric conversion unit (light receiving unit) is greater than the width of the second charge transfer channel that is located at the near side. Therefore, even if the charge density of the charge group traveling in the vicinity of the diverging point to the third charge transfer channel in the first charge transfer channel is wider than the charge distribution density of the charge group traveling in the vicinity of the diverging point to the second charge transfer channel in the first charge transfer channel, it is possible to reduce the possibility that a portion of charge of the charge group traveling in the vicinity of the diverging point to the third charge transfer channel is accumulated in a charge accumulation unit other than the second charge accumulation unit.

Consequently, according to the photodetection device having the aforementioned configuration, it is possible to improve temporal resolution in the detection of a timing at which light is incident.

A photodetection device according to one aspect of the present disclosure is provided with: a photoelectric converter that generates charge; a first charge transfer channel that has a first end and a second end, the first end being connected to the photoelectric converter, charge from the photoelectric converter being transferred in the first charge transfer channel in a first direction from the first end toward the second end; a second charge transfer channel that diverges from the first charge transfer channel at a first position of the first charge transfer channel; a third charge transfer channel that diverges from the first charge transfer channel at a second position of the first charge transfer channel, the second position being further than the first position from the first end in the first direction; a fourth charge transfer channel that diverges from the first charge transfer channel at a third position of the first charge transfer channel, the third position being located between the first position and the second position in the first direction; a first charge accumulator that accumulates charge transferred from the first charge transfer channel through the second charge transfer channel; a second charge accumulator that accumulates charge transferred from the first charge transfer channel through the third charge transfer channel; a third charge accumulator that accumulates charge transferred from the first charge transfer channel though the fourth charge transfer channel; a first gate electrode that switches between transfer and cutoff of charge in the first charge transfer channel; and at least one second gate electrode that switches between transfer and cutoff of charge in the second charge transfer channel, that switches between transfer and cutoff of charge in the third charge transfer channel, and that switches between transfer and cutoff of charge in the fourth charge transfer channel, wherein the first charge accumulator and the second charge accumulator are connected to read circuitry for reading charge accumulated in the first charge accumulator and the second charge accumulator, and the third charge accumulator is not connected to read circuity for reading charge accumulated in the third charge accumulator.

In the photodetection device having the aforementioned configuration, in the first charge transfer channel, even if a portion of a first charge group traveling in the vicinity of the diverging point to the second charge transfer channel and a portion of a second charge group traveling in the vicinity of the diverging point to the third charge transfer channel become mixed in the vicinity of the diverging point to the fourth charge transfer channel, the portions of charge of the charge groups that have become mixed in the vicinity of the diverging point to the fourth charge transfer channel are not read. With respect to this, the portion of the first charge group traveling in the vicinity of the diverging point to the second charge transfer channel is read as charge that has been accumulated in the first charge accumulation unit, and the portion of the second charge group traveling in the vicinity of the diverging point to the third charge transfer channel is read as charge that has been accumulated in the second charge accumulation unit.

Consequently, according to the photodetection device having the aforementioned configuration, it is possible to improve temporal resolution in the detection of a timing at which light is incident.

Furthermore, for example, the width of the fourth charge transfer channel may be less than the width of the second charge transfer channel and the width of the third charge transfer channel.

It is thereby possible to further increase the proportion of charge that is to be read. It is therefore possible to further improve temporal resolution in the detection of a timing at which light is incident.

A photodetection device according to one aspect of the present disclosure is provided with: a photoelectric converter that generates charge; a first charge transfer channel that has a first end and a second end, the first end being connected to the photoelectric converter, charge from the photoelectric converter being transferred in the first charge transfer channel in a first direction from the first end toward the second end; a second charge transfer channel that diverges from the first charge transfer channel at a first position of the first charge transfer channel; a third charge transfer channel that diverges from the first charge transfer channel at a second position of the first charge transfer channel, the second position being further than the first position from the first end in the first direction; a fourth charge transfer channel that diverges from the first charge transfer channel at a third position of the first charge transfer channel, the third position being located between the first position and the second position in the first direction; a first charge accumulator that accumulates charge transferred from the first charge transfer channel through the second charge transfer channel; a second charge accumulator that accumulates charge transferred from the first charge transfer channel through the third charge transfer channel; a third charge accumulator that accumulates charge transferred from the first charge transfer channel through the fourth charge transfer channel; a first gate electrode that switches between transfer and cutoff of charge in the first charge transfer channel; at least one second gate electrode that switches between transfer and cutoff of charge in the second charge transfer channel, that switches between transfer and cutoff of charge in the third charge transfer channel, and that switches between transfer and cutoff of charge in the fourth charge transfer channel; read circuity that is respectively connected to the first charge accumulator, the second charge accumulator, and the third charge accumulator, and that read charge accumulated in the first charge accumulator, the second charge accumulator, and the third charge accumulator; and a signal processor that is connected to the read circuity, wherein the signal processor performs signal processing using amounts of charge read from the first charge accumulator and the second charge accumulator, and not using an amount of the charge read from the third charge accumulator.

In the photodetection device having the aforementioned configuration, in a case where the first charge group and the second charge group are traveling through the first charge transfer channel, even if the charge of a region in which a portion of the first charge group and a portion of the second charge group have become mixed is read, it becomes possible to perform signal processing without using a signal corresponding to the charge of that mixed region.

Consequently, according to the photodetection device having the aforementioned configuration, it is possible to improve temporal resolution in the detection of a timing at which light is incident.

An imaging device according to one aspect of the present disclosure is provided with a pixel array in which a plurality of pixels configured from the aforementioned photodetection device are arranged in an array.

The plurality of pixels provided in the imaging device having the aforementioned configuration are configured from photodetection devices that can improve temporal resolution in the detection of a timing at which light is incident.

Consequently, according to the imaging device having the aforementioned configuration, it is possible to improve temporal resolution in the detection of a timing at which light is incident.

Hereinafter, specific examples of the photodetection device and the imaging device according to one aspect of the present disclosure will be described with reference to the drawings. The embodiments given here all represent specific examples of the present disclosure. Consequently, the numerical values, the shapes, the constituent elements, the arrangement and mode of connection of the constituent elements, the steps (processes), the order of the steps, and the like given in the following embodiments are examples and do not restrict the present disclosure. From among the constituent elements in the following embodiments, constituent elements that are not mentioned in the independent claims are constituent elements that may be optionally added. Furthermore, each drawing is a schematic view and is not necessarily depicted in an exact manner.

First Embodiment

Hereinafter, an imaging device according to the first embodiment will be described with reference to the drawings. This imaging device is provided with a pixel array in which a plurality of pixels configured from photodetection devices according to the first embodiment are arranged in an array.

[1-1. Configuration]

Here, first, a photodetection according to the first embodiment will be described.

Figure 1:
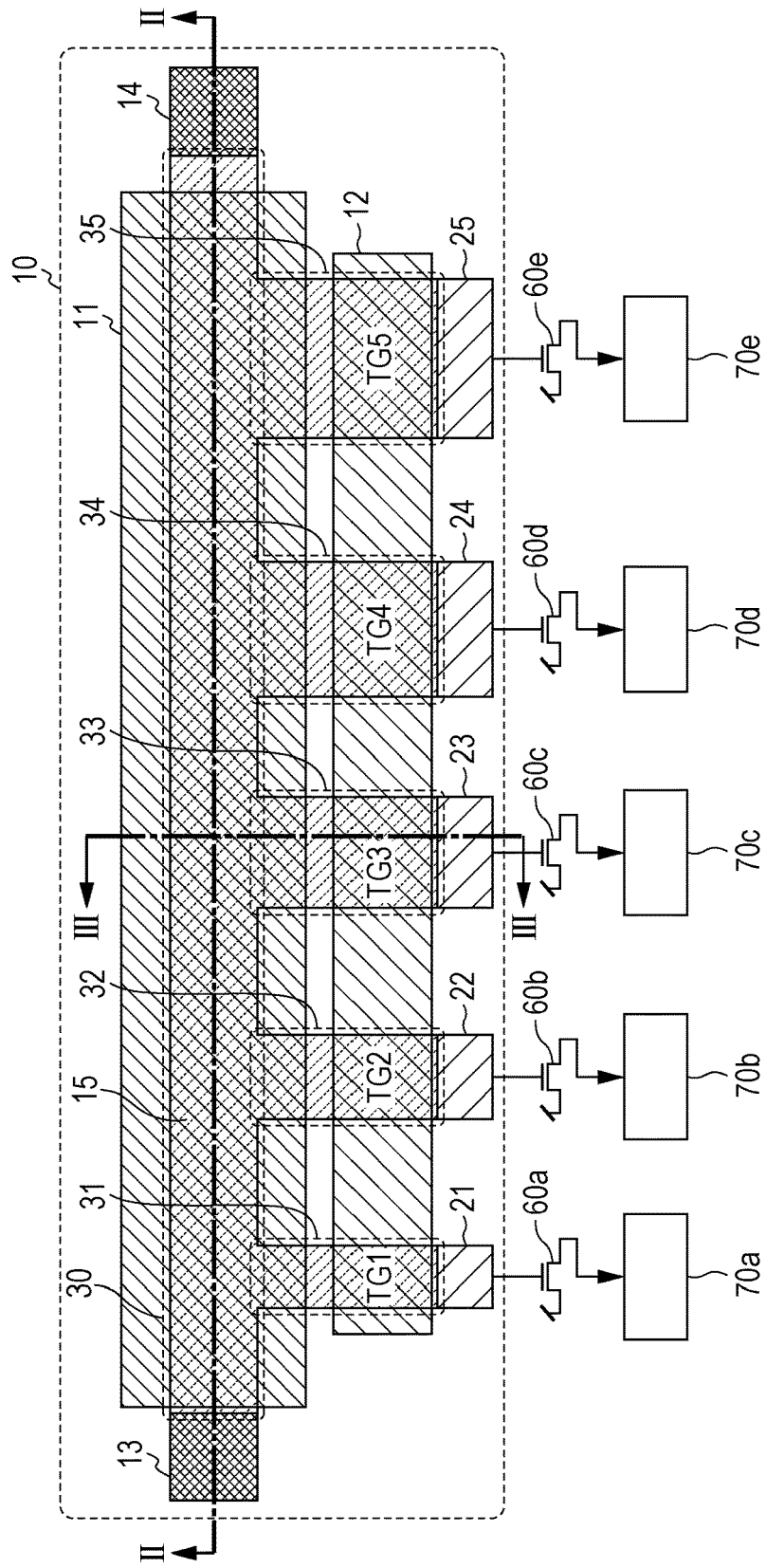
FIG. 1 is a plan view of a photodetection device according to a first embodiment.
Figure 2:
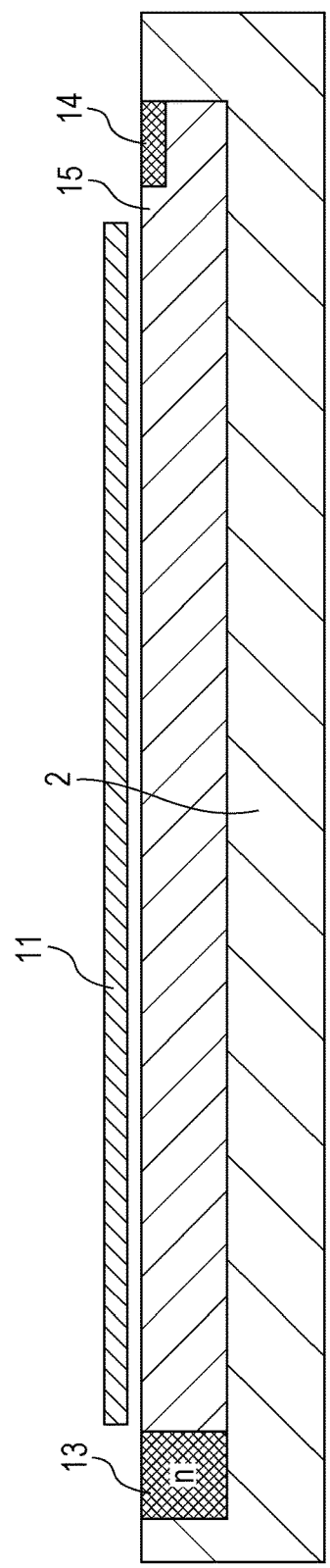
FIG. 2 is a cross-sectional view along line II-II of the photodetection device according to the first embodiment.
Figure 3:
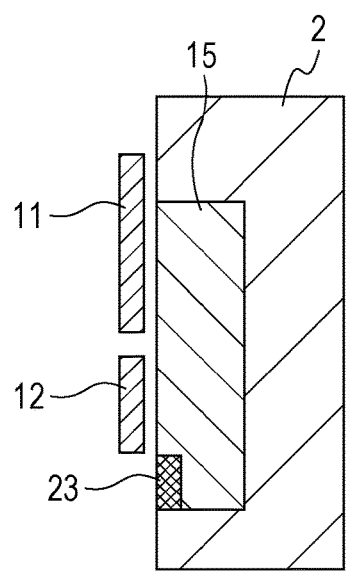
FIG. 3 is a cross-sectional view along line III-III of the photodetection device according to the first embodiment.

FIG. 1 is a plan view of a photodetection device 10 according to the first embodiment. FIG. 2 is a cross-sectional view along line II-II depicted in FIG. 1, of the photodetection device 10 according to the first embodiment. FIG. 3 is a cross-sectional view along line III-III depicted in FIG. 1, of the photodetection device 10 according to the first embodiment.

As depicted in FIGS. 1, 2, and 3, the photodetection device 10 is configured including a first gate electrode 11, a second gate electrode 12, a photoelectric conversion unit 13, a charge sweeping unit 14, an injection region 15, a first charge accumulation unit 21, a second charge accumulation unit 22, a third charge accumulation unit 23, a fourth charge accumulation unit 24, and a fifth charge accumulation unit 25.

As depicted in FIG. 1, the width of the fifth charge accumulation unit 25 is greater than the width of the fourth charge accumulation unit 24, the width of the fourth charge accumulation unit 24 is greater than the width of the third charge accumulation unit 23, the width of the third charge accumulation unit 23 is greater than the width of the second charge accumulation unit 22, and the width of the second charge accumulation unit 22 is greater than the width of the first charge accumulation unit 21. It should be noted that FIGS. 1, 2, and 3 are merely schematic drawings for illustration purposes, and the sizes of the parts in the drawings do not necessarily reflect the actual sizes. Likewise, also in other drawings, the size of an element depicted in the drawings may not match the actual size of that element.

The photoelectric conversion unit 13 includes a photoelectric conversion element that is capable of receiving incident light and generating charge. Here, a photodiode is given as an example of the photoelectric conversion element.

As depicted in FIGS. 2 and 3, in this example, the photoelectric conversion unit 13, the charge sweeping unit 14, the injection region 15, the first charge accumulation unit 21, the second charge accumulation unit 22, the third charge accumulation unit 23, the fourth charge accumulation unit 24, and the fifth charge accumulation unit 25 are formed within a semiconductor substrate 2 such as a silicon (Si) substrate. The semiconductor substrate 2 is not restricted to a substrate in which the entirety thereof is a semiconductor, and may be an insulating substrate or the like in which a semiconductor layer is provided on the surface of a side on which a photosensitive region is formed. Hereinafter, a p-type silicon substrate is given as an example of the semiconductor substrate 2. In this example, the photoelectric conversion unit 13 is formed by forming an impurity region (here, an n-type region) in the p-type silicon substrate. Furthermore, the injection region 15 is formed by forming an impurity region (here, an n-type region) having a concentration that is equivalent to or higher than that of the photoelectric conversion unit 13 in the p-type silicon substrate. Also, the first charge accumulation unit 21, the second charge accumulation unit 22, the third charge accumulation unit 23, the fourth charge accumulation unit 24, and the fifth charge accumulation unit 25 are formed by forming impurity regions (here, n-type regions) having a concentration that is higher than that of the injection region 15 in the p-type silicon substrate.

As depicted in FIG. 1, the width of the fifth charge accumulation unit 25 is greater than the width of the fourth charge accumulation unit 24, the width of the fourth charge accumulation unit 24 is greater than the width of the third charge accumulation unit 23, the width of the third charge accumulation unit 23 is greater than the width of the second charge accumulation unit 22, and the width of the second charge accumulation unit 22 is greater than the width of the first charge accumulation unit 21.

Furthermore, as depicted in FIG. 1, the injection region 15 is configured from a long main section 30, a first finger section 31, a second finger section 32, a third finger section 33, a fourth finger section 34, and a fifth finger section 35. One end of the main section 30 is connected to the photoelectric conversion unit 13 and the other end is connected to the charge sweeping unit 14. The first finger section 31 diverges from the main section 30 and is connected to the first charge accumulation unit 21. The second finger section 32 diverges from the main section 30 and is connected to the second charge accumulation unit 22. The third finger section 33 diverges from the main section 30 and is connected to the third charge accumulation unit 23. The fourth finger section 34 diverges from the main section 30 and is connected to the fourth charge accumulation unit 24. The fifth finger section 35 diverges from the main section 30 and is connected to the fifth charge accumulation unit 25.

As depicted in FIG. 1, the width of the fifth finger section 35 is equal to the width of the fifth charge accumulation unit 25. The width of the fourth finger section 34 is equal to the width of the fourth charge accumulation unit 24. The width of the third finger section 33 is equal to the width of the third charge accumulation unit 23. The width of the second finger section 32 is equal to the width of the second charge accumulation unit 22. The width of the first finger section 31 is equal to the width of the first charge accumulation unit 21. In other words, the width of the fifth finger section 35 is greater than the width of the fourth finger section 34. The width of the fourth finger section 34 is greater than the width of the third finger section 33. The width of the third finger section 33 is greater than the width of the second finger section 32. The width of the second finger section 32 is greater than the width of the first finger section 31. Furthermore, the fifth finger section 35 diverges from the main section 30 at a position that is further than the fourth finger section 34 from the photoelectric conversion unit 13. The fourth finger section 34 diverges from the main section 30 at a position that is further than the third finger section 33 from the photoelectric conversion unit 13 than the third finger section 33. The third finger section 33 diverges from the main section 30 at a position that is further than the second finger section 32 from the photoelectric conversion unit 13. The second finger section 32 diverges from the main section 30 at a position that is further than the first finger section 31 from the photoelectric conversion unit 13.

As depicted in FIGS. 1 to 3, the first gate electrode 11 is arranged overlaid above the main section 30. Also, the second gate electrode 12 extends over the first finger section 31 to the fifth finger section 35, and is arranged overlaid thereabove.

Here, a transistor formed by the second gate electrode 12 and the first finger section 31 is referred to as a TG1. A transistor formed by the second gate electrode 12 and the second finger section 32 is referred to as a TG2. A transistor formed by the second gate electrode 12 and the third finger section 33 is referred to as a TG3. A transistor formed by the second gate electrode 12 and the fourth finger section 34 is referred to as a TG4. A transistor formed by the second gate electrode 12 and the fifth finger section 35 is referred to as a TG5.

A predetermined potential is applied to a gate electrode positioned above the injection region 15 (here, the first gate electrode 11 or the second gate electrode 12, for example), and an inversion layer is thereby formed on a surface of the injection region 15. This inversion layer functions as a charge transfer channel that transfers charge generated by the photoelectric conversion unit 13 to any of the charge sweeping unit 14, the first charge accumulation unit 21, the second charge accumulation unit 22, the third charge accumulation unit 23, the fourth charge accumulation unit 24, or the fifth charge accumulation unit 25.

Figure 4:
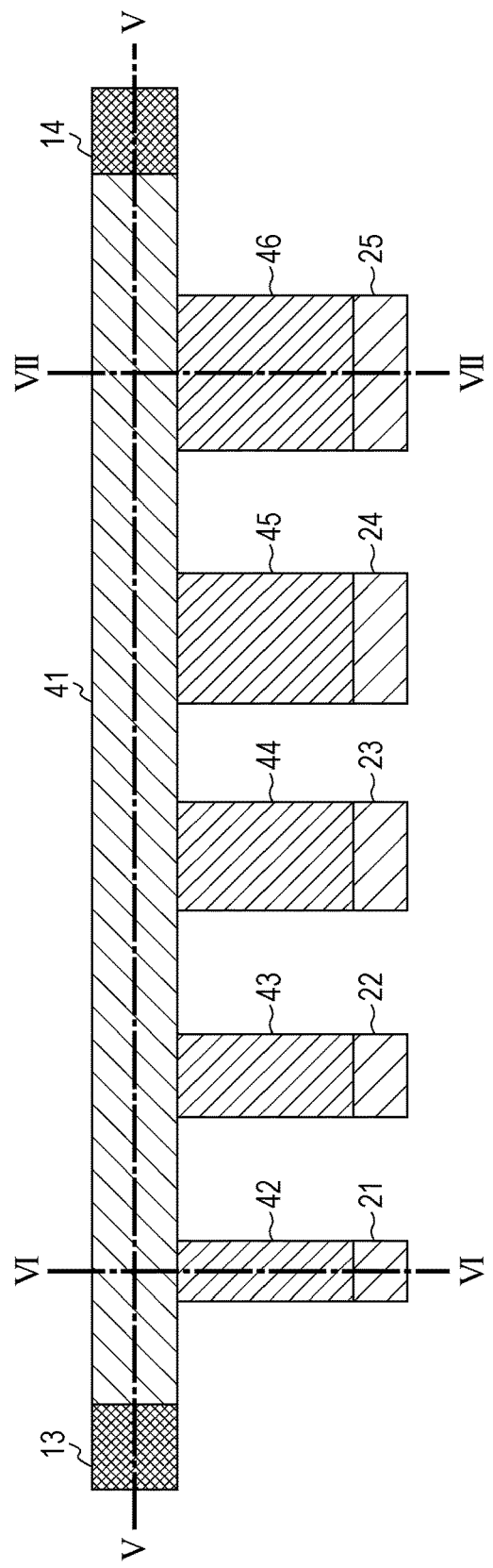
FIG. 4 is a schematic view of charge transfer channels formed in the photodetection device according to the first embodiment.

FIG. 4 is a schematic view schematically depicting charge transfer channels formed in a case where a first predetermined potential is applied to the first gate electrode 11 and a second predetermined potential is applied to the second gate electrode 12. Here, the first predetermined potential is a potential for forming an inversion layer on the surface of the injection region 15 positioned below the first gate electrode 11. Furthermore, the second predetermined potential is a potential for forming inversion layers on the surfaces of the injection region 15 positioned below the second gate electrode 12.

As depicted in FIG. 4, the charge transfer channels formed on the surface of the injection region 15 are configured from a first charge transfer channel 41, a second charge transfer channel 42, a third charge transfer channel 43, a fourth charge transfer channel 44, a fifth charge transfer channel 45, and a sixth charge transfer channel 46. Here, the width of the first charge transfer channel 41 is substantially equal to the width of the main section 30. The width of the sixth charge transfer channel 46 is substantially equal to the width of the fifth finger section 35. The width of the fifth charge transfer channel 45 is substantially equal to the width of the fourth finger section 34. The width of the fourth charge transfer channel 44 is substantially equal to the width of the third finger section 33. The width of the third charge transfer channel 43 is substantially equal to the width of the second finger section 32. The width of the second charge transfer channel 42 is substantially equal to the width of the first finger section 31. Here, "substantially equal" means that a difference in width is within 20%, for example.

Therefore, the width of the sixth charge transfer channel 46 is greater than the width of the fifth charge transfer channel 45. The width of the fifth charge transfer channel 45 is greater than the width of the fourth charge transfer channel 44. The width of the fourth charge transfer channel 44 is greater than the width of the third charge transfer channel 43. The width of the third charge transfer channel 43 is greater than the width of the second charge transfer channel 42. The width of the second charge transfer channel 42 is greater than the width of the first charge transfer channel 41. Furthermore, the sixth charge transfer channel 46 diverges from the first charge transfer channel 41 at a position that is further than the fifth charge transfer channel 45 from the photoelectric conversion unit 13. The fifth charge transfer channel 45 diverges from the first charge transfer channel 41 at a position that is further than the fourth charge transfer channel 44 from the photoelectric conversion unit 13. The fourth charge transfer channel 44 diverges from the first charge transfer channel 41 at a position that is further than the third charge transfer channel 43 from the photoelectric conversion unit 13. The third charge transfer channel 43 diverges from the first charge transfer channel 41 at a position that is further than the second charge transfer channel 42 from the photoelectric conversion unit 13.

The first charge transfer channel 41 transfers charge generated by the photoelectric conversion unit 13 to the charge sweeping unit 14 due to the potential of the charge sweeping unit 14 being set to a predetermined potential that is lower than the potential of the photoelectric conversion unit 13.

Figure 5:
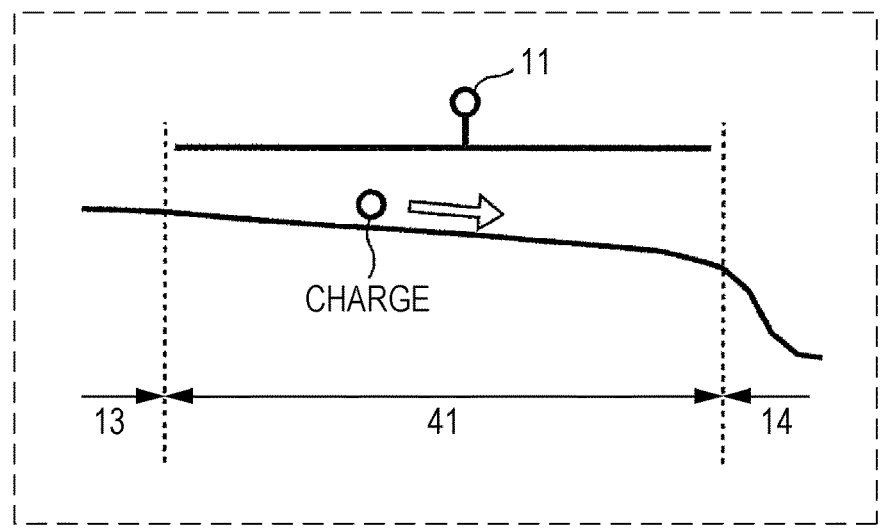
FIG. 5 is a schematic view depicting the way in which a first charge transfer channel transfers charge.

FIG. 5 is a schematic view depicting the way in which the first charge transfer channel 41 transfers charge, in a cross section along line V-V depicted in FIG. 4. The solid line indicates the potential in the cross section along line V-V depicted in FIG. 4.

As depicted in the same drawing, due to the potential of the charge sweeping unit 14 being set to a predetermined potential that is lower than the potential of the photoelectric conversion unit 13, the potential within the first charge transfer channel 41 slants from the photoelectric conversion unit 13 side toward the charge sweeping unit 14 side. Thus, the first charge transfer channel 41 transfers the charge generated by the photoelectric conversion unit 13 to the charge sweeping unit 14.

Figure 6:
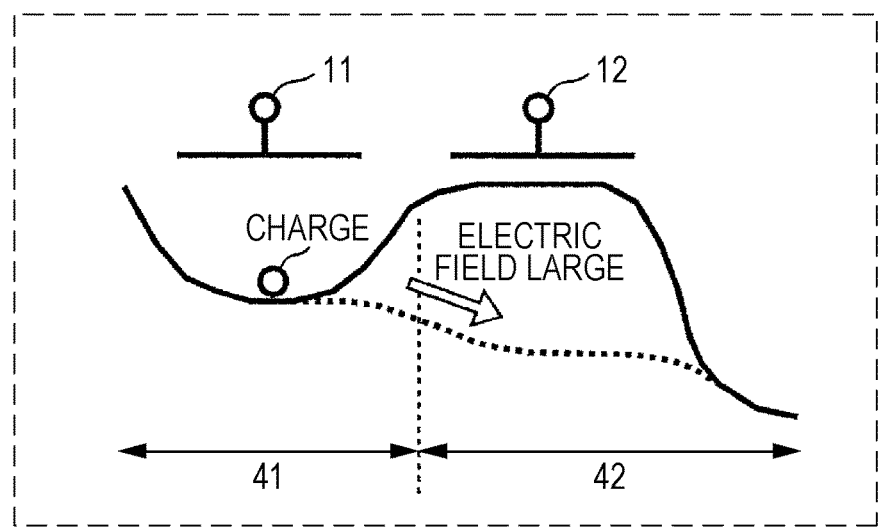
FIG. 6 is a schematic view depicting the way in which a second charge transfer channel transfers charge.

FIG. 6 is a schematic view depicting the way in which the second charge transfer channel 42 transfers charge, in a cross section along line VI-VI depicted in FIG. 4. The solid line indicates the potential when the transistor TG1 is off, in the cross section along line VI-VI depicted in FIG. 4. The dotted line indicates the potential when the transistor TG1 is on, in the cross section along line VI-VI depicted in FIG. 4.

As depicted in the same drawing, when the potential of the first charge accumulation unit 21 is set to a predetermined potential lower than the potential of a diverging point to the second charge transfer channel 42 in the first charge transfer channel 41, the potential in the second charge transfer channel 42 slants from the first charge transfer channel 41 side toward the first charge accumulation unit 21 side as indicated by the dotted line in FIG. 6. Therefore, the second charge transfer channel 42 transfers a portion of charge of the charge group being transferred through the first charge transfer channel 41, to the first charge accumulation unit 21.

However, the second charge transfer channel 42 is not formed in a case where the TG1 is off. In this case, the potential between the diverging point to the second charge transfer channel 42 in the first charge transfer channel 41 and the first charge accumulation unit 21 becomes as indicated by the solid line in FIG. 6. Therefore, in this case, the charge traveling through the first charge transfer channel 41 is not transferred to the first charge accumulation unit 21.

Similarly, when each of the potentials of the second charge accumulation unit 22 to the fifth charge accumulation unit 25 is set to predetermined potentials lower than the potentials of the diverging points to the third charge transfer channel 43 to the sixth charge transfer channel 46 in the first charge transfer channel 41, each of the third charge transfer channel 43 to the sixth charge transfer channel 46 transfers a portion of charge of the charge group being transferred through the first charge transfer channel 41, to the second charge accumulation unit 22 to the fifth charge accumulation unit 25.

Figure 7:
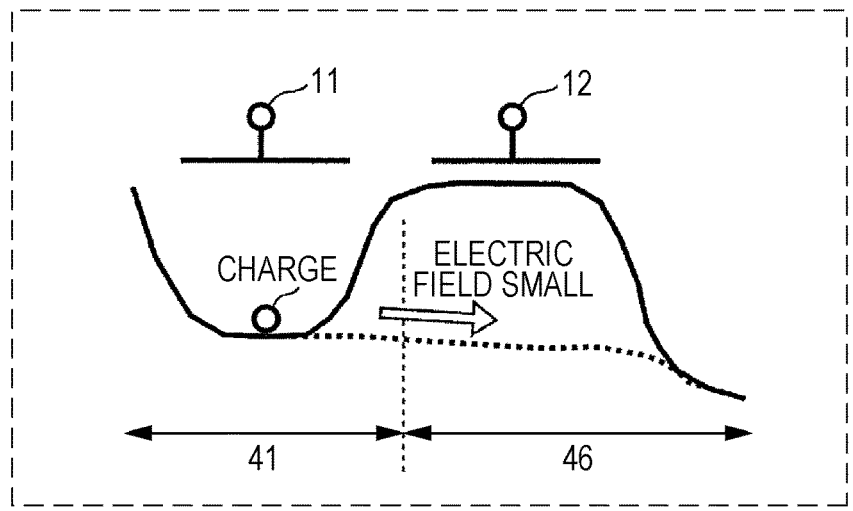
FIG. 7 is a schematic view depicting the way in which a sixth charge transfer channel transfers charge.

As an example, FIG. 7 is a schematic view depicting the way in which the sixth charge transfer channel 46 transfers charge, in a cross section along line VII-VII depicted in FIG. 4. The solid line indicates the potential when the transistor TG5 is off, in the cross section along line VII-VII depicted in FIG. 4. The dotted line indicates the potential when the transistor TG5 is on, in the cross section along line VII-VII depicted in FIG. 4.

However, for example, as understood when comparing FIGS. 6 and 7, the potentials at the diverging points to each of the other charge transfer channels in the first charge transfer channel 41 sequentially decrease from the side of the diverging point to the second charge transfer channel 42 to the side of the diverging point to the sixth charge transfer channel 46. Therefore, the charge transfer amount per unit width in each of the second charge transfer channel 42 to the sixth charge transfer channel 46 sequentially decreases from the second charge transfer channel 42 to the sixth charge transfer channel 46. In other words, the current driving capability per unit gate width in the TG1 to the TG5 declines sequentially from the TG1 to TG5.

Figure 8:
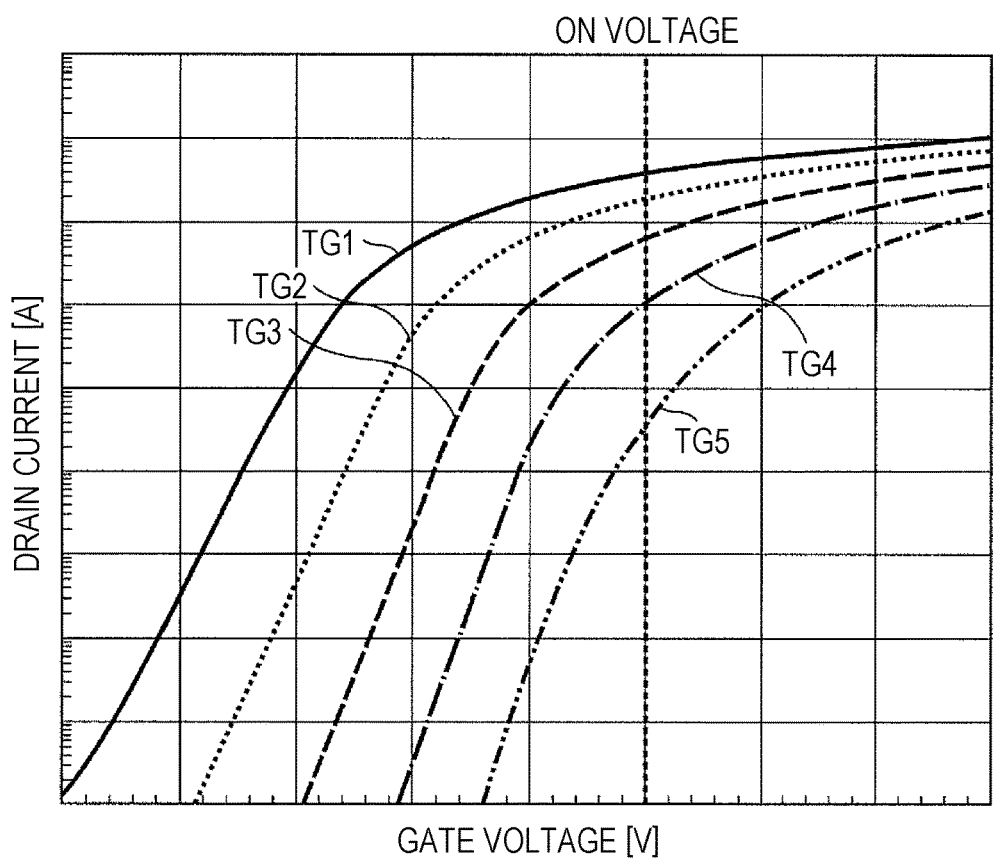
FIG. 8 is a characteristics diagram depicting current-voltage characteristics per unit gate width for each transistor.

FIG. 8 depicts, with regard to each of the TG1 to TG5, a characteristics diagram showing current-voltage characteristics per unit gate width for each transistor TG1 to TG5 in a case where the first charge transfer channel 41 side is taken as the source and the first charge accumulation unit 21 to the fifth charge accumulation unit 25 side is taken as the drain.

The first charge accumulation unit 21 accumulates charge transferred through the second charge transfer channel 42. The second charge accumulation unit 22 accumulates charge transferred through the third charge transfer channel 43. The third charge accumulation unit 23 accumulates charge transferred through the fourth charge transfer channel 44. The fourth charge accumulation unit 24 accumulates charge transferred through the fifth charge transfer channel 45. The fifth charge accumulation unit 25 accumulates charge transferred through the sixth charge transfer channel 46.

As depicted in FIG. 1, the first charge accumulation unit 21 to the fifth charge accumulation unit 25 are respectively connected to read circuits 70a to 70e, which read accumulated charge, via source follower transistors 60a to 60e.

The first gate electrode 11 and the second gate electrode 12 are formed from polysilicon to which electrical conductivity has been imparted by being injected with an impurity, for example.

The first gate electrode 11 can switch between whether or not an inversion layer is formed on the surface of the injection region 15 positioned below the first gate electrode 11, by switching an applied voltage.

In other words, the first gate electrode 11 switches between transfer and cutoff of charge that has passed through the first charge transfer channel 41, by switching the applied voltage.

Similarly, the second gate electrode 12 can switch between whether or not inversion layers are formed on the surfaces of the injection region 15 positioned below the second gate electrode 12 by switching an applied voltage.

In other words, the second gate electrode 12 switches between transfer and cutoff of charge that has passed through the second charge transfer channel 42, switches between transfer and cutoff of charge that has passed through the third charge transfer channel 43, switches between transfer and cutoff of charge that has passed through the fourth charge transfer channel 44, switches between transfer and cutoff of charge that has passed through the fifth charge transfer channel 45, and switches between transfer and cutoff of charge that has passed through the sixth charge transfer channel 46, by switching the applied voltage.

Next, an imaging device according to the first embodiment and configured including the photodetection device 10 having the aforementioned construction will be described.

Figure 9:
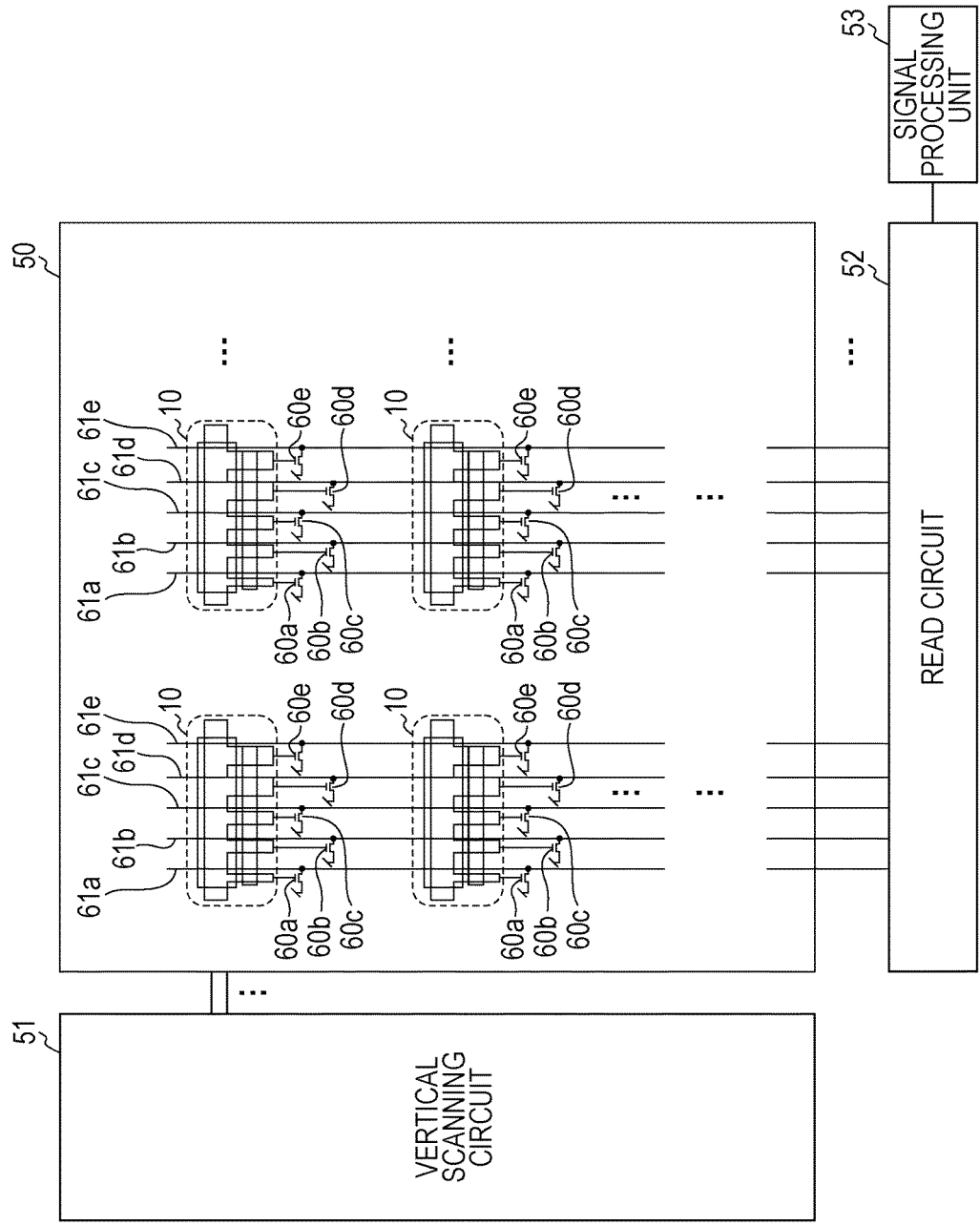
FIG. 9 is a block diagram depicting the configuration of an imaging device according to the first embodiment.

FIG. 9 is a block diagram depicting the configuration of an imaging device 1 according to the first embodiment.

As depicted in the same drawing, the imaging device 1 is provided with a pixel array 50, a vertical scanning circuit 51, a read circuit 52, and a signal processing unit 53.

The pixel array 50 is configured with a plurality of pixels configured from photodetection devices 10 being arranged in an array (a matrix form, for example).

In each photodetection device 10, the first charge accumulation unit 21 to the fifth charge accumulation unit 25 are connected to the read circuit 52 via the source follower transistors 60a to 60e and read lines 61a to 61e. In other words, the read circuits 70a to 70e in FIG. 1 each correspond to the read circuit 52 in FIG. 9. Here, the read lines 61a to 61e constitute common signal lines in column units.

Furthermore, each photodetection device 10 is connected to the vertical scanning circuit 51 via a plurality of common control signal lines (not depicted) in row units.

The vertical scanning circuit 51 controls the operation of each photodetection device 10 in row units, via the plurality of common control signal lines (not depicted) in row units, with respect to the pixel array 50.

The vertical scanning circuit 51 repeatedly carries out control of the photodetection devices 10 according to row units in predetermined periods, sequentially from the row at the uppermost side to the row at the lowermost side of the pixel array 50.

The read circuit 52 operates in synchronization with the vertical scanning circuit 51 and reads, from the pixel array 50, in the row units controlled by the vertical scanning circuit 51, signals corresponding to the amounts of charge accumulated in the first charge accumulation unit 21 to the fifth charge accumulation unit 25 in each photodetection device 10 positioned in the row in question. The signals that have been read are then output to the signal processing unit 53.

The signal processing unit 53 carries out various types of signal processing with respect to the signals that have been output from the read circuit 52. As an example, the signal processing unit 53 may be configured including a processor and a memory and realized by the processor executing a program stored in the memory, or may be realized by means of dedicated hardware.

[1-2. Examination]

Hereinafter, the photodetection device 10 will be examined.

Figure 10:
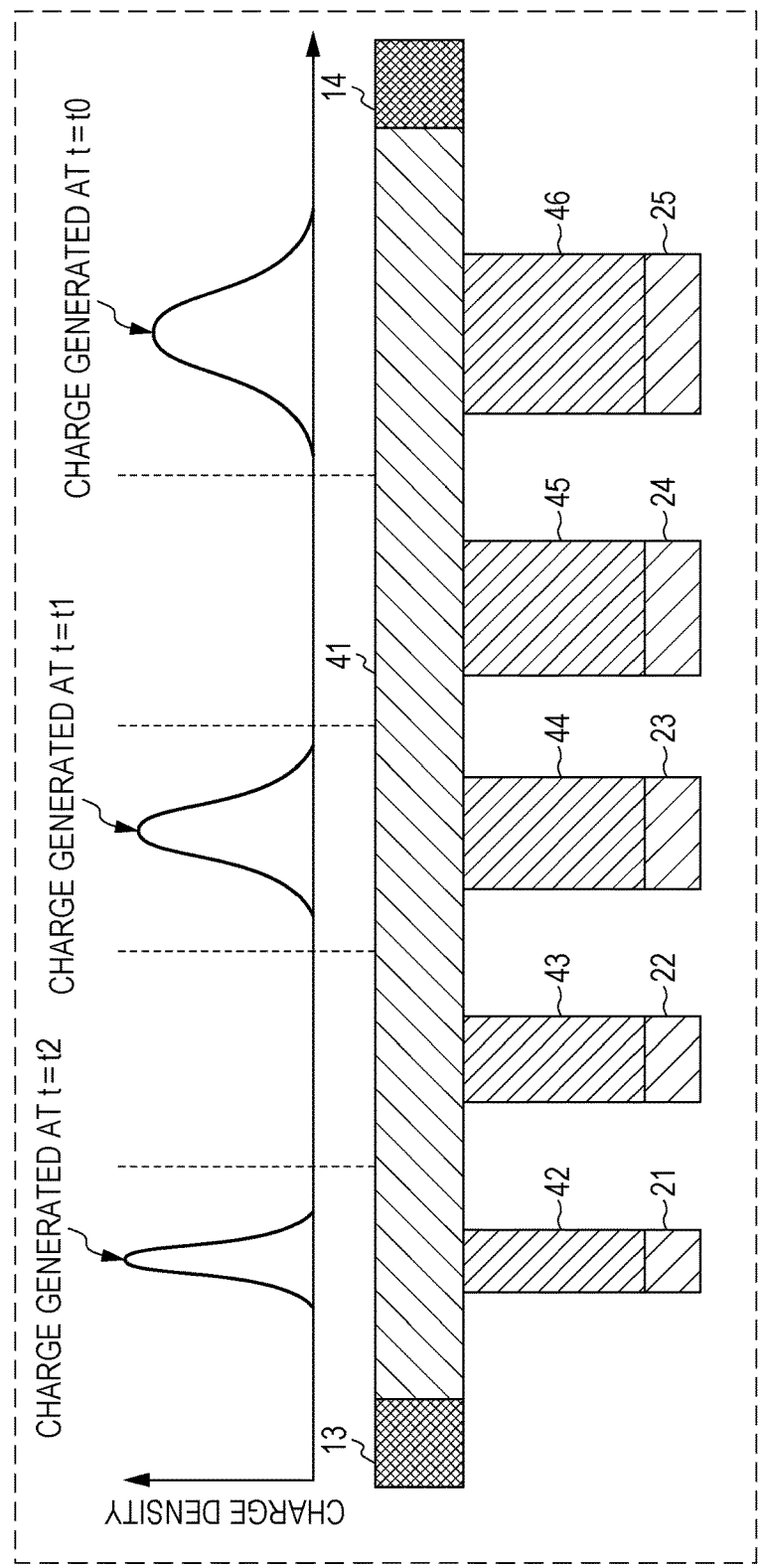
FIG. 10 is a schematic view depicting the distribution of a charge group that is traveling through the first charge transfer channel.

FIG. 10 is a schematic view depicting the distribution of a charge group that is traveling through the first charge transfer channel 41, in the photodetection device 10.

As depicted in the same drawing, the distribution of the charge density of the charge group traveling through the first charge transfer channel 41 widens as the travel distance thereof increases, in other words, as the charge group travels further from the photoelectric conversion unit 13.

However, as mentioned above, the widths of the second charge transfer channel 42 to the sixth charge transfer channel 46 that diverge from the first charge transfer channel 41 increase as the diverging position becomes further from the photoelectric conversion unit 13.

Therefore, for example, the charge distribution density of a charge group traveling in the vicinity of a diverging point to a charge transfer channel at a position that is comparatively far from the photoelectric conversion unit 13 in terms of the diverging position from the first charge transfer channel 41 (here, the sixth charge transfer channel 46, for example; hereinafter, also referred to as a "distant charge transfer channel") becomes wider than the charge distribution density of a charge group traveling in the vicinity of a diverging point to a charge transfer channel at a position that is comparatively near to the photoelectric conversion unit 13 (here, the second charge transfer channel 42, for example). However, even in this case, it is possible to reduce the possibility that a portion of the charge of the charge group traveling in the vicinity of the diverging point to that distant charge transfer channel is accumulated in a charge accumulation unit other than the corresponding charge accumulation unit (here, the fifth charge accumulation unit 25, for example).

Consequently, according to the photodetection device 10, it is possible to improve temporal resolution in the detection of a timing at which light is incident.

Furthermore, as mentioned above, as depicted in FIG. 8, the current driving capability per unit gate width in the TG1 to TG5 declines as the distance from the photoelectric conversion unit 13 increases.

However, as depicted in FIG. 1, the gate width of the TG1 to TG5 increases as the distance from the photoelectric conversion unit 13 increases.

Therefore, in a transistor in a position that is comparatively far from the photoelectric conversion unit 13 (here, the TG5, for example), although there is a decline in the current driving capability per unit gate width compared to a transistor in a position that is comparatively near to the photoelectric conversion unit 13 (here, the TG1, for example), a decline in the current driving capability as a transistor is suppressed due to the increase in the gate width.

Thus, in the photodetection device 10, even with a transistor in a position that is comparatively far from the photoelectric conversion unit 13 (here, the TG5, for example), the charge required for reading is accumulated in the corresponding charge accumulation unit (here, the fifth charge accumulation unit 25, for example), and therefore the period in which that transistor is required to be on can be shortened.

Consequently, according to the photodetection device 10, a read cycle in which charge is read can be shortened.

Second Embodiment

Here, an imaging device according to the second embodiment in which a portion of the configuration has been altered from that of the imaging device 1 according to the first embodiment will be described.

In the first embodiment, the photodetection device 10 constituting the imaging device 1 had a configuration in which read circuits are respectively connected to charge accumulation units (the first charge accumulation unit 21 to the fifth charge accumulation unit 25).

In contrast, in the second embodiment, a photodetection device constituting the imaging device according to the second embodiment has a configuration in which read circuits are connected to some of the charge accumulation units while read circuits are not connected to some other charge accumulation units.

[2-1. Configuration]

Hereinafter, an imaging device according to the second embodiment will be described with reference to the drawings, focusing on the differences with the imaging device 1 according to the first embodiment.

Figure 11:
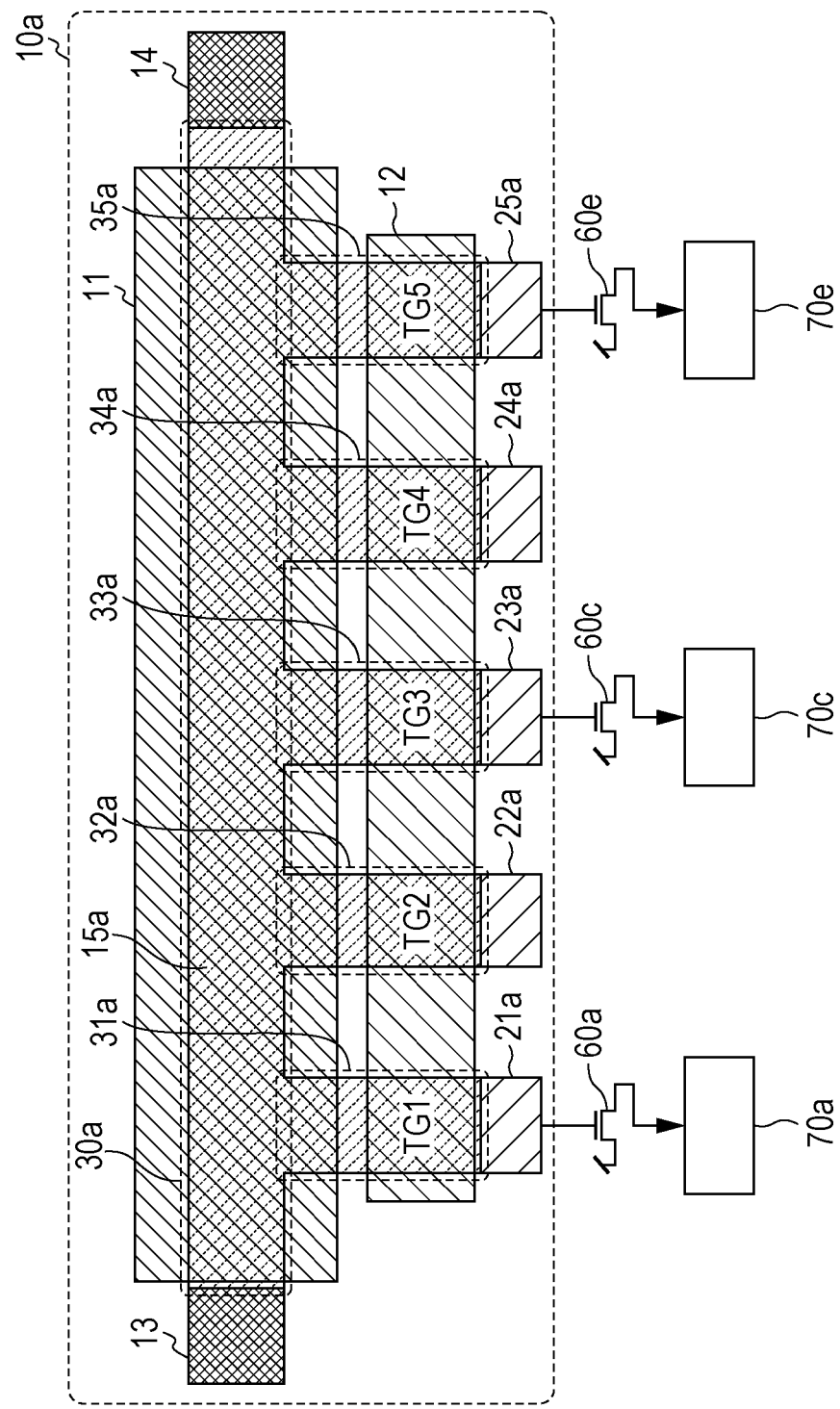
FIG. 11 is a plan view of a photodetection device according to the second embodiment.

FIG. 11 is a plan view of a photodetection device 10a according to the second embodiment.

As depicted in the same drawing, from the photodetection device 10 according to the first embodiment, the injection region 15 has been altered to an injection region 15a in the photodetection device 10a. Furthermore, the first charge accumulation unit 21 has been altered to a first charge accumulation unit 21a. Furthermore, the second charge accumulation unit 22 has been altered to a second charge accumulation unit 22a. Furthermore, the third charge accumulation unit 23 has been altered to a third charge accumulation unit 23a. Furthermore, the fourth charge accumulation unit 24 has been altered to a fourth charge accumulation unit 24a. Furthermore, the fifth charge accumulation unit 25 has been altered to a fifth charge accumulation unit 25a.

Also, the first charge accumulation unit 21a, the third charge accumulation unit 23a, and the fifth charge accumulation unit 25a are respectively connected to a read circuit 70a, a read circuit 70c, and a read circuit 70e. However, the second charge accumulation unit 22a and the fourth charge accumulation unit 24a have been altered so as to not be connected to a read circuit.

In other words, the photodetection device 10a has a configuration in which charge accumulation units that are connected to a read circuit (here, the first charge accumulation unit 21a, the third charge accumulation unit 23a, and the fifth charge accumulation unit 25a, for example) and charge accumulation units that are not connected to a read circuit (here, the second charge accumulation unit 22a and the fourth charge accumulation unit 24a) are arranged in an alternating manner from the photoelectric conversion unit 13 side.

Furthermore, as depicted in FIG. 11, the width of the first charge accumulation unit 21a, the width of the second charge accumulation unit 22a, the width of the third charge accumulation unit 23a, the width of the fourth charge accumulation unit 24a, and the width of the fifth charge accumulation unit 25a are equal to each other.

From the injection region 15 according to the first embodiment, the main section 30 has been altered to a main section 30a in the injection region 15a. Furthermore, the first finger section 31 has been altered to a first finger section 31a. Furthermore, the second finger section 32 has been altered to a second finger section 32a. Furthermore, the third finger section 33 has been altered to a third finger section 33a. Furthermore, the fourth finger section 34 has been altered to a fourth finger section 34a. Furthermore, the fifth finger section 35 has been altered to a fifth finger section 35a.

As mentioned above, the width of the first charge accumulation unit 21a, the width of the second charge accumulation unit 22a, the width of the third charge accumulation unit 23a, the width of the fourth charge accumulation unit 24a, and the width of the fifth charge accumulation unit 25a are equal to each other. Thus, as depicted in FIG. 11, the width of the first finger section 31a, the width of the second finger section 32a, the width of the third finger section 33a, the width of the fourth finger section 34a, and the width of the fifth finger section 35a are equal to each other.

Figure 12:
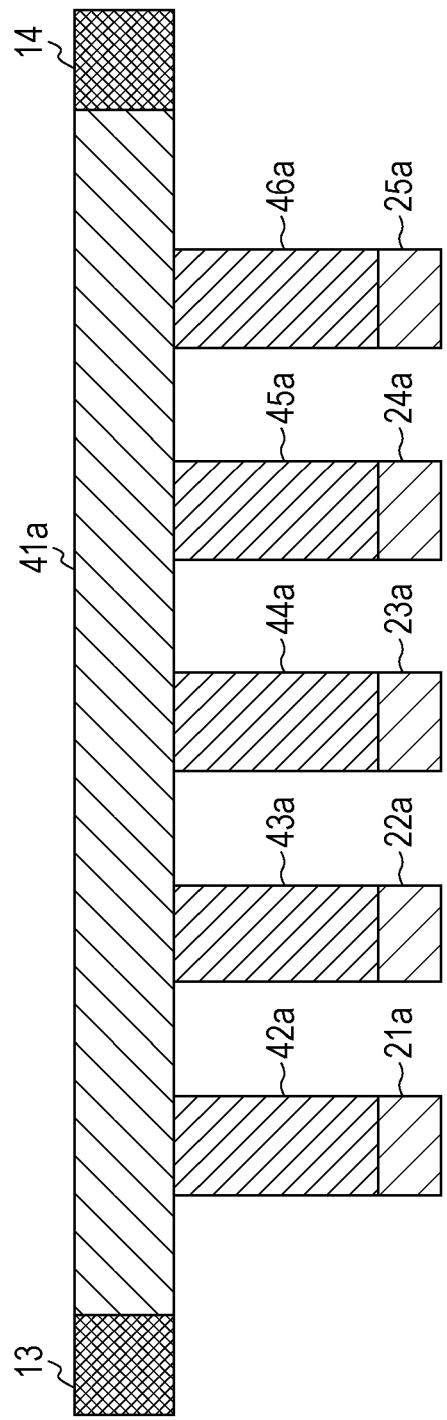
FIG. 12 is a schematic view of charge transfer channels formed in the photodetection device according to a second embodiment.

FIG. 12 is a schematic view schematically depicting charge transfer channels formed in a case where a first predetermined potential is applied to the first gate electrode 11 and a second predetermined potential is applied to the second gate electrode 12. Here, the first predetermined potential is a potential for forming an inversion layer on the surface of the injection region 15a positioned below the first gate electrode 11, and the second predetermined potential is a potential for forming inversion layers on the surfaces of the injection region 15a positioned below the second gate electrode 12.

As depicted in FIG. 12, from the charge transfer channels according to the first embodiment, the second charge transfer channel 42 has been altered to a second charge transfer channel 42a, in the charge transfer channels formed on the surface of the injection region 15a. Furthermore, the third charge transfer channel 43 has been altered to a third charge transfer channel 43a. Furthermore, the fourth charge transfer channel 44 has been altered to a fourth charge transfer channel 44a. Furthermore, the fifth charge transfer channel 45 has been altered to a fifth charge transfer channel 45a. Furthermore, the sixth charge transfer channel 46 has been formed so as to be altered to a sixth charge transfer channel 46a.

Here, the width of the second charge transfer channel 42a is substantially equal to the width of the first finger section 31a. Furthermore, the width of the third charge transfer channel 43a is substantially equal to the width of the second finger section 32a. Furthermore, the width of the fourth charge transfer channel 44a is substantially equal to the width of the third finger section 33a. Furthermore, the width of the fifth charge transfer channel 45a is substantially equal to the width of the fourth finger section 34a. Furthermore, the width of the sixth charge transfer channel 46a is substantially equal to the width of the fifth finger section 35a. Therefore, the width of the second charge transfer channel 42a, the width of the third charge transfer channel 43a, the width of the fourth charge transfer channel 44a, the width of the fifth charge transfer channel 45a, and the width of the sixth charge transfer channel 46a are equal to each other.

Figure 13:
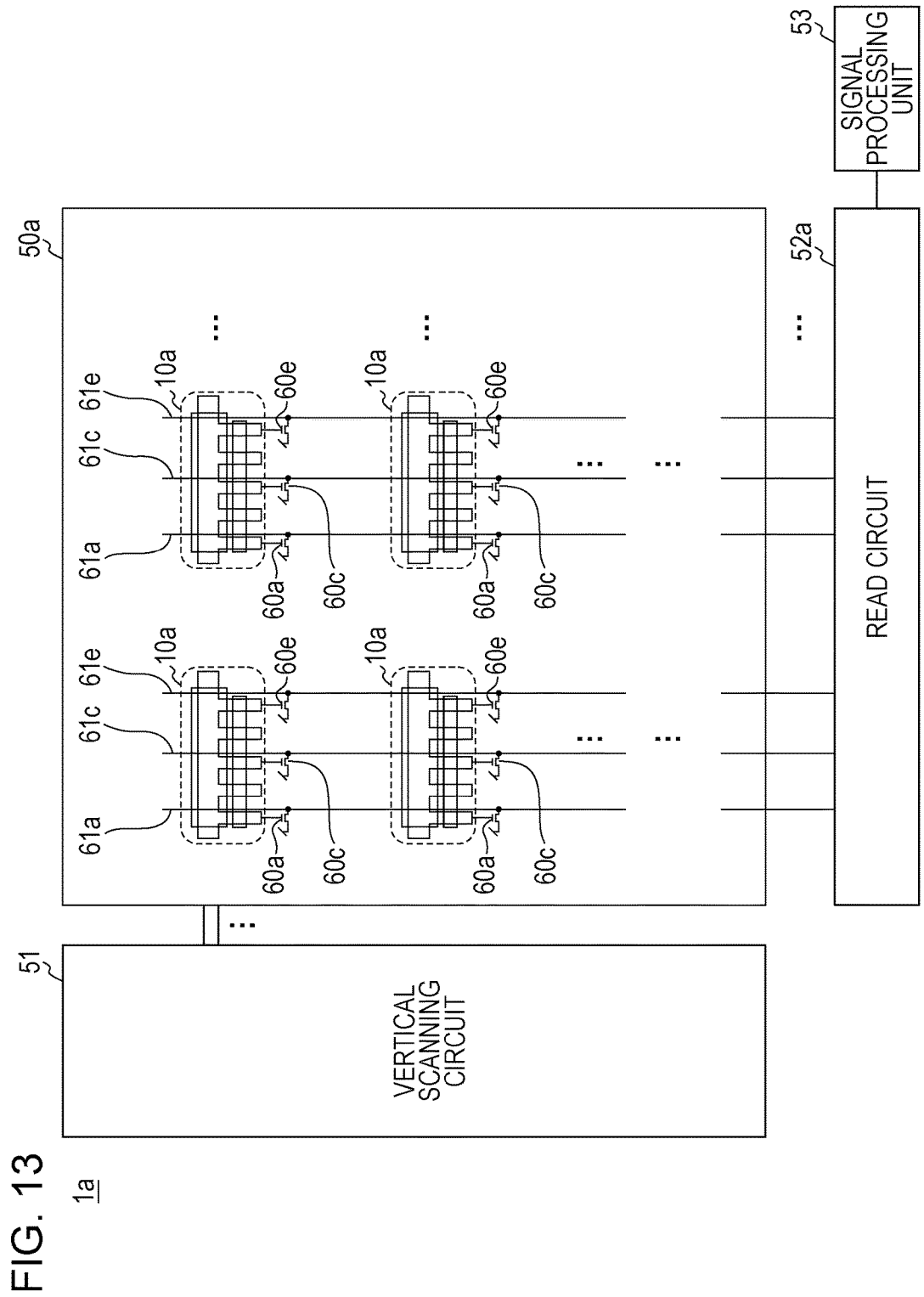
FIG. 13 is a block diagram depicting the configuration of an imaging device according to the second embodiment.

FIG. 13 is a block diagram depicting the configuration of an imaging device 1a according to the second embodiment.

As depicted in the same drawing, from the imaging device 1 according to the first embodiment, the pixel array 50 has been altered to a pixel array 50a and the read circuit 52 has been altered to a read circuit 52a in the imaging device 1a.

From the pixel array 50 according to the first embodiment, in the pixel array 50a, each pixel arranged in an array (here, a matrix form) has been altered from the photodetection device 10 according to the first embodiment to the photodetection device 10a. Also, alterations have been implemented in such a way that the source follower transistors 60b and 60d have been removed from among the source follower transistors 60a to 60e corresponding to each photodetection device 10, and the read lines 61b and 61d have been removed from among the read lines 61a to 61e corresponding to each photodetection device 10.

The read circuit 52 according to the first embodiment has been altered to the read circuit 52a. In the read circuit 52a, the charge accumulation units from which charge is to be read have been altered to the three charge accumulation units, that is, the first charge accumulation unit 21a, the third charge accumulation unit 23a, and the fifth charge accumulation unit 25a, in each photodetection device 10a.

[2-2. Examination]

Hereinafter, the photodetection device 10a will be examined.

Figure 14:
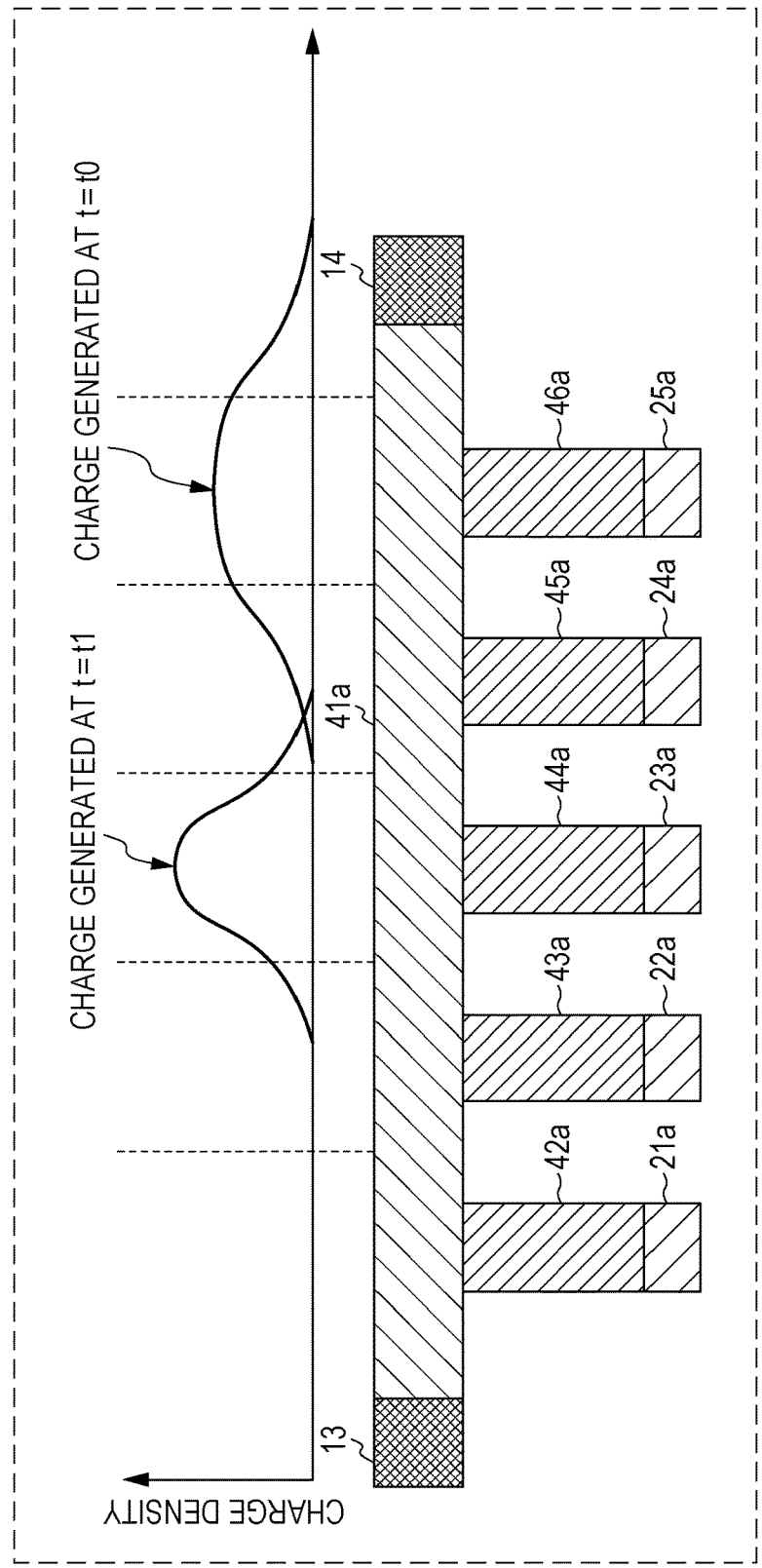
FIG. 14 is a schematic view depicting the distribution of a charge group that is traveling through a first charge transfer channel.

FIG. 14 is a schematic view depicting the distribution of a charge group that is traveling through the first charge transfer channel 41, in the photodetection device 10a.

As depicted in the same drawing, each charge group traveling through the first charge transfer channel 41 has a wide charge distribution. Therefore, in a case where a first charge group and a second charge group are traveling through the first charge transfer channel 41, a portion of the first charge group and a portion of the second charge group sometimes become mixed.

With the photodetection device 10a, in the first charge transfer channel 41, even if a portion of the first charge group traveling in the vicinity of the diverging point to the second charge transfer channel 42a and a portion of the second charge group traveling in the vicinity of the diverging point to the fourth charge transfer channel 44a become mixed in the vicinity of the diverging point channel to the third charge transfer channel 43a, the portions of charge of the charge groups that have become mixed in the vicinity of the diverging point of the third charge transfer channel 43a are not read. With respect to this, the portion of the first charge group traveling in the vicinity of the diverging point to the second charge transfer channel 42a is read as charge that has been accumulated in the first charge accumulation unit 21a, and the portion of the second charge group traveling in the vicinity of the diverging point to the fourth charge transfer channel 44a is read as charge that has been accumulated in the third charge accumulation unit 23a. The same is true if the second charge transfer channel 42a is substituted with the fourth charge transfer channel 44a, the fourth charge transfer channel 44a is substituted with the sixth charge transfer channel 46a, the third charge transfer channel 43a is substituted with the fifth charge transfer channel 45a, the first charge accumulation unit 21a is substituted with the third charge accumulation unit 23a, and the third charge accumulation unit 23a is substituted with the fifth charge accumulation unit 25a.

Consequently, according to the photodetection device 10a, it is possible to improve temporal resolution in the detection of a timing at which light is incident.

Furthermore, as mentioned above, charge accumulation units that are not connected to a read circuit (here, the second charge accumulation unit 22a and the fourth charge accumulation unit 24a) are arranged between charge accumulation units that are connected to a read circuit (here, the first charge accumulation unit 21a, the third charge accumulation unit 23a, and the fifth charge accumulation unit 25a, for example).

Thus, the difference between the times when charge groups used for reading are generated increases. However, since the mixing of charge can be suppressed among charge groups, it is possible to improve the ability to separate charge groups.

Consequently, according to the photodetection device 10a, it is possible to improve temporal resolution in the detection of a timing at which light is incident.

Third Embodiment

Here, an imaging device according to the third embodiment in which a portion of the configuration has been altered from that of the imaging device 1a according to the second embodiment will be described.

In the third embodiment, a photodetection device constituting the imaging device according to the third embodiment has been altered to the following configuration, with respect to the photodetection device 10a constituting the imaging device 1a according to the second embodiment. That is, the widths of charge accumulation units that are not connected to a read circuit and the widths of charge transfer channels that are connected to those charge accumulation units are less than the widths of charge accumulation units that are connected to a read circuit and the widths of charge transfer channels that are connected to those charge accumulation units.

[3-1. Configuration]

Hereinafter, an imaging device according to the third embodiment will be described with reference to the drawings, focusing on the differences with the imaging device 1a according to the second embodiment.

Figure 15:
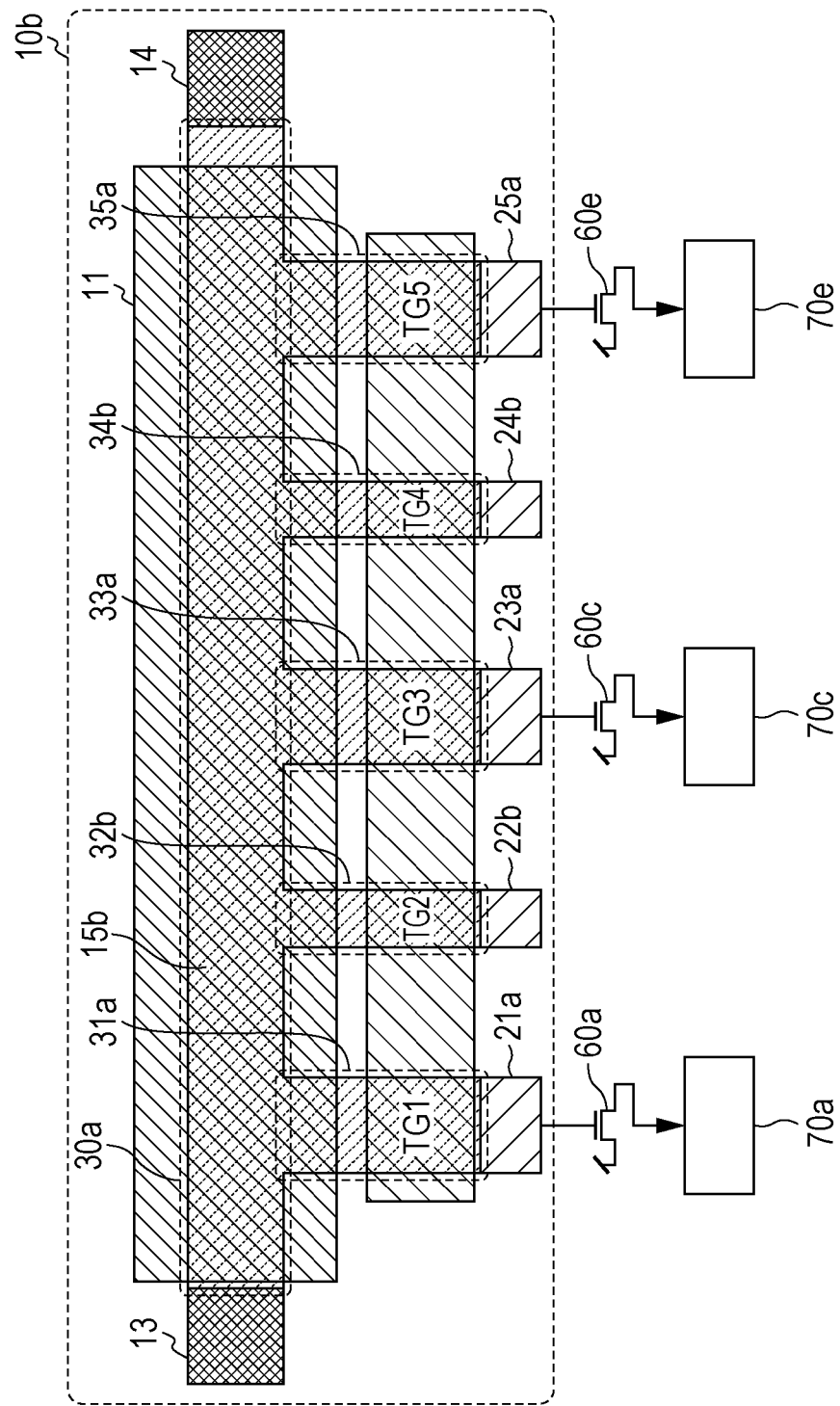
FIG. 15 is a plan view of a photodetection device according to a third embodiment.

FIG. 15 is a plan view of a photodetection device 10b according to the third embodiment.

As depicted in the same drawing, from the photodetection device 10a according to the second embodiment, the injection region 15a has been altered to an injection region 15b, the second charge accumulation unit 22a has been altered to a second charge accumulation unit 22b, and the fourth charge accumulation unit 24a has been altered to a fourth charge accumulation unit 24b in the photo detection device 10b.

The second charge accumulation unit 22b has been altered, from the second charge accumulation unit 22a according to the second embodiment, so as to be narrower.

The fourth charge accumulation unit 24b has been altered, from the fourth charge accumulation unit 24a according to the second embodiment, so as to be narrower and to be equal to the width of the second charge accumulation unit 22b.

As a result, as depicted in FIG. 15, the width of the second charge accumulation unit 22b and the width of the fourth charge accumulation unit 24b are equal to each other, and, in addition, the width of the second charge accumulation unit 22b and the width of the fourth charge accumulation unit 24b are less than the width of the first charge accumulation unit 21a, the width of the third charge accumulation unit 23a, and the width of the fifth charge accumulation unit 25a.

From the injection region 15a according to the second embodiment, the second finger section 32a has been altered to a second finger section 32b, and the fourth finger section 34a has been altered to a fourth finger section 34b, in the injection region 15b.

As mentioned above, the width of the second charge accumulation unit 22b and the width of the fourth charge accumulation unit 24b are equal to each other, and, in addition, the width of the second charge accumulation unit 22b and the width of the fourth charge accumulation unit 24b are less than the width of the first charge accumulation unit 21a, the width of the third charge accumulation unit 23a, and the width of the fifth charge accumulation unit 25a. Thus, as depicted in FIG. 15, the width of the second finger section 32b and the width of the fourth finger section 34b are equal to each other, and, in addition, the width of the second finger section 32b and the width of the fourth finger section 34b are less than the width of the first finger section 31a, the width of the third finger section 33a, and the width of the fifth finger section 35a.

Figure 16:
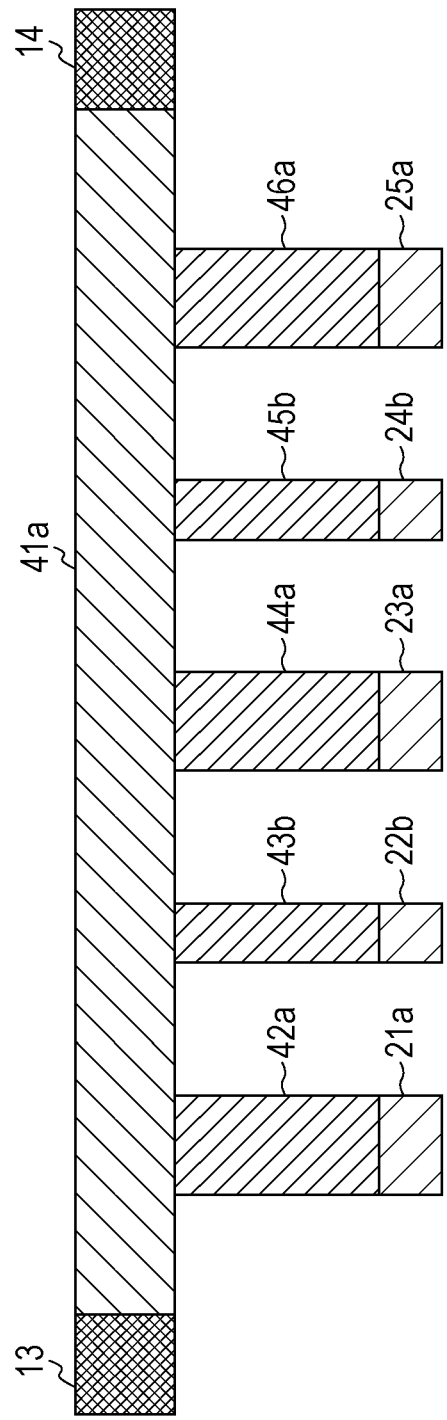
FIG. 16 is a schematic view of charge transfer channels formed in the photodetection device according to the third embodiment.

FIG. 16 is a schematic view schematically depicting charge transfer channels formed in a case where a first predetermined potential is applied to the first gate electrode 11 and a second predetermined potential is applied to the second gate electrode 12. Here, the first predetermined potential is a potential for forming an inversion layer on the surface of the injection region 15b positioned below the first gate electrode 11, and the second predetermined potential is a potential for forming inversion layers on the surfaces of the injection region 15b positioned below the second gate electrode 12.

As depicted in FIG. 16, from the charge transfer channels according to the second embodiment, the third charge transfer channel 43a has been altered to a third charge transfer channel 43b and the fifth charge transfer channel 45a has been altered to a fifth charge transfer channel 45b in the charge transfer channels formed on the surface of the injection region 15b.

Here, the width of the third charge transfer channel 43b is substantially equal to the width of the second finger section 32b, and the width of the fifth charge transfer channel 45b is substantially equal to the width of the fourth finger section 34b. Therefore, as depicted in FIG. 16, the width of the third charge transfer channel 43b and the width of the fifth charge transfer channel 45b are equal to each other. In addition, the width of the third charge transfer channel 43b and the width of the fifth charge transfer channel 45b are less than the width of the second charge transfer channel 42a, the width of the fourth charge transfer channel 44a, and the width of the sixth charge transfer channel 46a.

Figure 17:
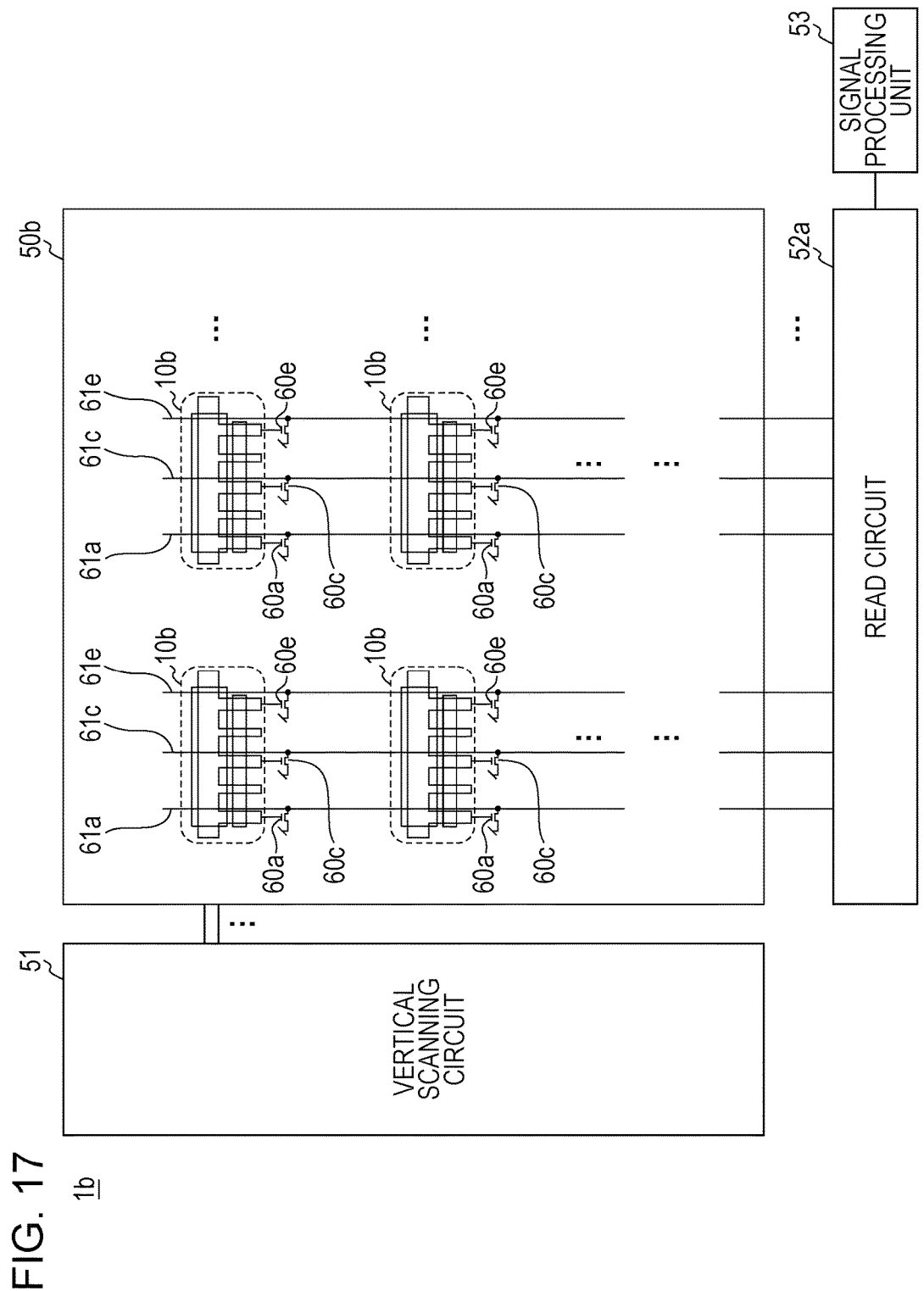
FIG. 17 is a block diagram depicting the configuration of an imaging device according to the third embodiment.

FIG. 17 is a block diagram depicting the configuration of an imaging device 1b according to the third embodiment.

As depicted in the same drawing, from the imaging device 1a according to the second embodiment, the pixel array 50a has been altered to a pixel array 50b in the imaging device 1b.

In the pixel array 50b, each pixel arranged in an array (here, a matrix form) has been altered from the photodetection device 10a according to the second embodiment to the photo detection device 10b.

[3-2. Examination]

Hereinafter, the photo detection device 10b will be examined.

As mentioned above, in the photo detection device 10b, the widths of charge accumulation units that are not connected to a read circuit and the widths of charge transfer channels that are connected to those charge accumulation units are less than the widths of charge accumulation units that are connected to a read circuit and the widths of charge transfer channels that are connected to those charge accumulation units. It is thereby possible to further increase the proportion of charge that is to be read.

Consequently, according to the photo detection device 10b, it is possible to further improve temporal resolution in the detection of a timing at which light is incident.

Fourth Embodiment

Here, an imaging device according to the fourth embodiment in which a portion of the configuration has been altered from that of the imaging device 1a according to the second embodiment will be described.

In the fourth embodiment, in the imaging device according to the fourth embodiment, five charge accumulation units in each photodetection device 10a are connected to the read circuit 52. Also, meanwhile, in signal processing of the imaging device according to the fourth embodiment, which is carried out using signals corresponding to read charge, signals corresponding to charge that has been read from the first charge accumulation unit 21a, the third charge accumulation unit 23a, and the fifth charge accumulation unit 25a are used, and signals corresponding to charge that has been read from the second charge accumulation unit 22b and the fourth charge accumulation unit 24b are not used.

[4-1. Configuration]

Hereinafter, the imaging device according to the fourth embodiment will be described with reference to the drawings, focusing on the differences with the imaging device 1a according to the second embodiment.

Figure 18:
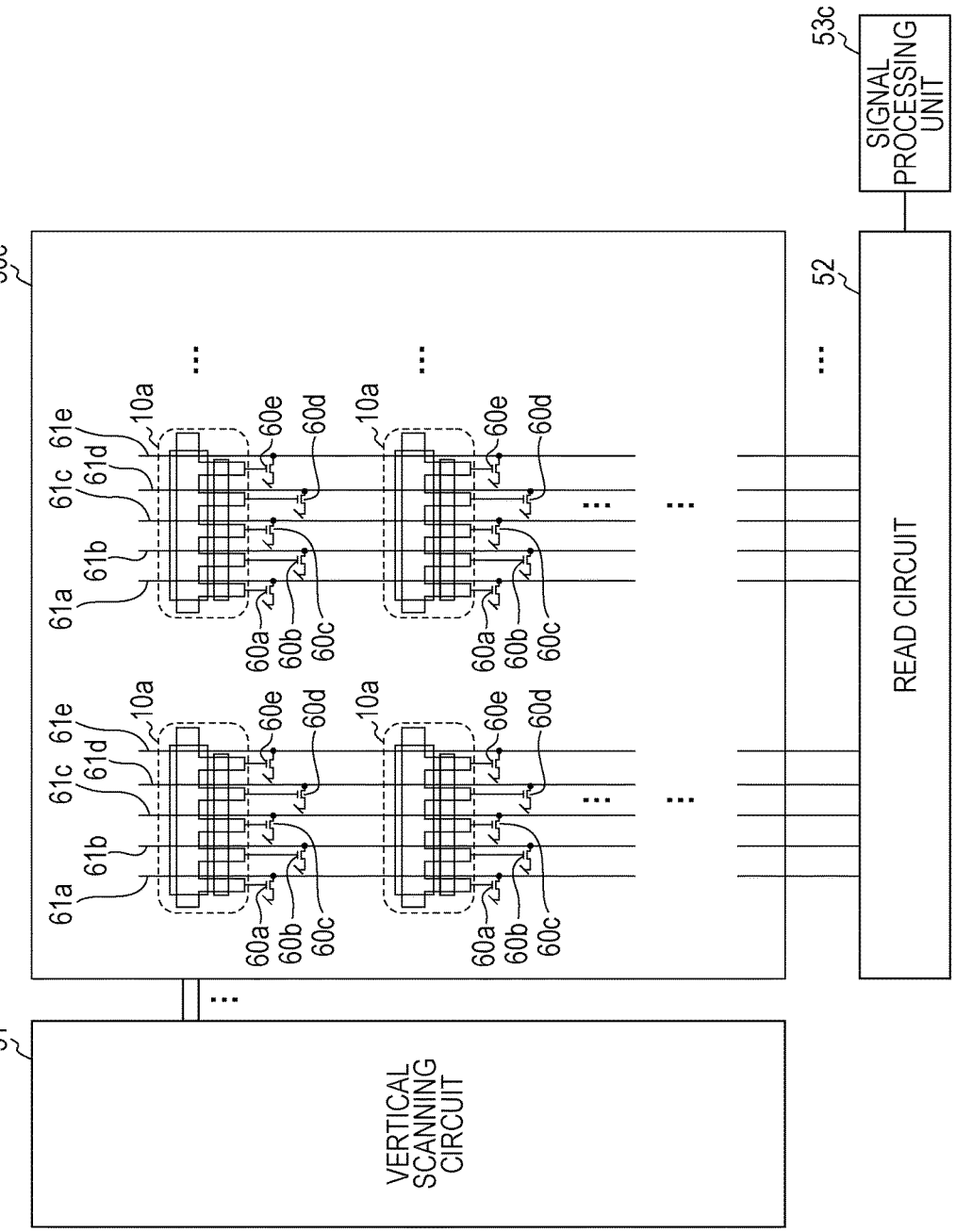
FIG. 18 is a block diagram depicting the configuration of an imaging device according to a fourth embodiment.

FIG. 18 is a block diagram depicting the configuration of an imaging device 1c according to the fourth embodiment.

As depicted in the same drawing, from the imaging device 1a according to the second embodiment, in the imaging device 1c, the pixel array 50a has been altered to a pixel array 50c, the read circuit 52a has been altered to the read circuit 52 according to the first embodiment, and the signal processing unit 53 has been altered to a signal processing unit 53c.

In the pixel array 50c, the source follower transistors 60b and 60d and the read lines 61b and 61d have been added to the pixel array 50a according to the second embodiment, and the second charge accumulation unit 22a and the fourth charge accumulation unit 24a in each photodetection device 10a are connected to the read circuit 52.

The signal processing unit 53c, which corresponds to the signal processing unit 53 according to the second embodiment, carried out signal processing using some signals selected from among signals corresponding to charge that has been read from the read circuit 52.

Here, the signal processing unit 53c selects signals to be used in the signal processing, in such a way that signals corresponding to charge that has been read from the first charge accumulation unit 21a, the third charge accumulation unit 23a, and the fifth charge accumulation unit 25a are used, and signals corresponding to charge that has been read from the second charge accumulation unit 22a and the fourth charge accumulation unit 24a are not used, from among signals that have been read from the read circuit 52.

In other words, the signal processing unit 53c carries out signal processing using signals corresponding to charge that has been read from at least some charge accumulation units (here, the first charge accumulation unit 21a, the third charge accumulation unit 23a, and the fifth charge accumulation unit 25a) excluding other charge accumulation units (here, the second charge accumulation unit 22a and the fourth charge accumulation unit 24a) from among a plurality of charge accumulation units (here, the first charge accumulation unit 21a to the fifth charge accumulation unit 25a).

[4-2. Examination]

Hereinafter, the imaging device 1c will be examined.

As mentioned above, in the imaging device 1c, similar to the imaging device 1a according to the second embodiment, signal processing is carried out using signals corresponding to charge that has been read from the first charge accumulation unit 21a, the third charge accumulation unit 23a, and the fifth charge accumulation unit 25a, and not using signals corresponding to charge that has been read from the second charge accumulation unit 22a and the fourth charge accumulation unit 24a, in each photodetection device 10a.

Thus, the imaging device 1c is able to carry out signal processing that is similar to that of the imaging device 1a according to the second embodiment.

Consequently, the imaging device 1c demonstrates an effect that is similar to that of the imaging device 1a according to the second embodiment.

(Supplement)

Embodiments 1 to 4 have been described as mentioned above as exemplifications of the technique disclosed in the present application. However, the technique according to the present disclosure is not restricted thereto and can also be applied to an embodiment in which an alteration, substitution, addition, omission, or the like has been implemented as appropriate provided it does not depart from the gist of the present disclosure.

Hereinafter, examples of modified examples in the present disclosure will be listed.

(1) In the first embodiment, the photodetection device 10 was described as being provided with five charge accumulation units. However, the number of charge accumulation units provided in the photodetection device 10 is not necessarily restricted to the example of five as long as there are two or more.

(2) In the first embodiment, the photodetection device 10 was described as being a structure provided with one second gate electrode 12. However, it is not always necessary for the second gate electrode 12 to be a single structure, and the second gate electrode 12 may be configured divided into a plurality. That is, it is sufficient as long as the second gate electrode 12 is able to realize switching between transfer and cutoff of charge that has passed through the second charge transfer channel 42, switching between transfer and cutoff of charge that has passed through the third charge transfer channel 43, switching between transfer and cutoff of charge that has passed through the fourth charge transfer channel 44, switching between transfer and cutoff of charge that has passed through the fifth charge transfer channel 45, and switching between transfer and cutoff of charge that has passed through the sixth charge transfer channel 46, by switching the applied voltage.

(3) In the second embodiment, the photodetection device 10a was described with the widths of the first charge accumulation unit 21a to the fifth charge accumulation unit 25a being equal to each other and the widths of the first finger section 31a to the fifth finger section 35a being equal to each other. However, it is not always necessary for the photodetection device 10a to be restricted to the aforementioned configuration. As an example, it is also feasible for the photodetection device 10a to be configured in such a way that the widths of the first charge accumulation unit 21a to the fifth charge accumulation unit 25a increase as the distance from the photoelectric conversion unit 13 increases, and the widths of the first finger section 31a to the fifth finger section 35a increase as the distance from the photoelectric conversion unit 13 increases, similar to the photodetection device 10 according to the first embodiment.

(4) In the fourth embodiment, the signal processing unit 53c was described as selecting signals to be used in signal processing, in such a way that signals corresponding to charge that has been read from the first charge accumulation unit 21a, the third charge accumulation unit 23a, and the fifth charge accumulation unit 25a are used, and signals corresponding to charge that has been read from the second charge accumulation unit 22a and the fourth charge accumulation unit 24a are not used, from among signals corresponding to charge that has been read from the read circuit 52. However, the selection of which signal corresponding to charge that has been read from a charge accumulation unit is to be used and which signal corresponding to charge that has been read from a charge accumulation unit is not to be used is not restricted to the aforementioned selection example and may be any kind of selection. As another example, a configuration example is also feasible in which the signal processing unit 53c carries out the selection in such a way that signals corresponding to charge that has been read from the second charge accumulation unit 22a and the fourth charge accumulation unit 24a are used, and signals corresponding to charge that has been read from the first charge accumulation unit 21a, the third charge accumulation unit 23a, and the fifth charge accumulation unit 25a are not used, or the like.

(5) In the fourth embodiment, the read circuit 52 reads charge amounts from the first charge accumulation unit 21a to the fifth charge accumulation unit 25a and outputs signals, and the signal processing unit 53c carries out signal processing using some selected signals among the signals that have been output from the read circuit 52. However, as long as it is possible to select the signals to be used in the signal processing, the embodiment is not necessarily restricted to the example realized by means of the aforementioned configuration. As another example, the read circuit 52 may selectively output signals corresponding to charge amounts that have been read from the first charge accumulation unit 21a to the fifth charge accumulation unit 25a, and the signal processing unit 53c may carry out the signal processing using the signals that have been output from the read circuit 52. More specifically in other words, for example, the read circuit 52 may selectively output signals corresponding to charge amounts that have been read from the first charge accumulation unit 21a, the third charge accumulation unit 23a, and the fifth charge accumulation unit 25at, and the read circuit 52 may not output signals corresponding to charge amounts that have been read from the second charge accumulation unit 22a and the fourth charge accumulation unit 24a, from among the charge amounts that have been read from the first charge accumulation unit 21a to the fifth charge accumulation unit 25a.

(6) In the first embodiment, a photodiode was given as an example of a photoelectric converter. However, it is not always necessary for the photoelectric converter to be restricted to a photodiode as long as it is able to receive incident light and generate charge. As an example, the photoelectric converter may be an element configured with photoelectric conversion films being layered.

The photodetection device and imaging device according to the present disclosure can be widely used for devices which detect light that has been input.

What is claimed is:
1. A photodetection device, comprising:
a photoelectric converter that generates charge;

a first charge transfer channel that has a first end and a second end, the first end being connected to the photoelectric converter, charge from the photoelectric converter being transferred in the first charge transfer channel in a first direction from the first end toward the second end;

a second charge transfer channel that diverges from the first charge transfer channel at a first position of the first charge transfer channel;

a third charge transfer channel that diverges from the first charge transfer channel at a second position of the first charge transfer channel, the second position being further than the first position from the first end in the first direction;

a first charge accumulator that accumulates charge transferred from the first charge transfer channel through the second charge transfer channel;

a second charge accumulator that accumulates charge transferred from the first charge transfer channel through the third charge transfer channel;

a first gate electrode that switches between transfer and cutoff of charge in the first charge transfer channel; and at least one second gate electrode that switches between transfer and cutoff of charge in the second charge transfer channel, and that switches between transfer and cutoff of charge in the third charge transfer channel, wherein a width of the third charge transfer channel is greater than a width of the second charge transfer channel in a plan view.

2. The photodetection device according to claim 1, further comprising:

a fourth charge transfer channel that diverges from the first charge transfer channel at a third position of the first charge transfer channel, the third position being located between the first position and the second position in the first direction; and a third charge accumulator that accumulates charge transferred from the first charge transfer channel through the fourth charge transfer channel, wherein the at least one second gate electrode switches between transfer and cutoff of charge in the fourth charge transfer channel, the first charge accumulator and the second charge accumulator being connected to read circuitry for reading charge accumulated in the first charge accumulator and the second charge accumulator, and the third charge accumulator is not connected to read circuitry for reading charge accumulated in the third charge accumulator.

3. The photodetection device according to claim 2, wherein, a width of the fourth charge transfer channel is less than a width of the second charge transfer channel and a width of the third charge transfer channel in the plan view.

4. The photodetection device according to claim 1, further comprising:

a fourth charge transfer channel that diverges from the first charge transfer channel at a third position of the first charge transfer channel, the third position being located between the first position and the second position in the first direction;

a third charge accumulator that accumulates charge transferred from the first charge transfer channel through the fourth charge transfer channel;

read circuity that is connected to the first charge accumulator, the second charge accumulator, and the third charge accumulator, the read circuity reading charge accumulated in the first charge accumulator, the second charge accumulator, and the third charge accumulator; and a signal processor that is connected to the read circuity, wherein the at least one second gate electrode switches between transfer and cutoff of charge in the fourth charge transfer channel, and the signal processor performs signal processing using amounts of charge read from the first charge accumulator and the second charge accumulator, and not using an amount of charge read from the third charge accumulator.

5. The photodetection device according to claim 1, further comprising:

a charge sweeper that is connected to the second end of the first charge transfer channel.

6. An imaging device, comprising a pixel array in which a plurality of pixels configured from the photodetection device according to claim 1 are arranged in an array.

* * * * *